US012745635B2

(12) United States Patent
Yamaguchi

(10) Patent No.: US 12,745,635 B2
(45) Date of Patent: Sep. 22, 2026

(54) SEMICONDUCTOR DEVICE

(71) Applicant: FUJI ELECTRIC CO., LTD., Kawasaki (JP)

(72) Inventor: Sota Yamaguchi, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 550 days.

(21) Appl. No.: 18/324,145

(22) Filed: May 25, 2023

(65) Prior Publication Data

US 2024/0021496 A1 Jan. 18, 2024

(30) Foreign Application Priority Data

Jul. 15, 2022 (JP) ................................ 2022-113919

(51) Int. Cl.

| | |
|---|---|
| ***H10W 40/47*** | (2026.01) |
| ***H10W 70/40*** | (2026.01) |
| ***H10W 74/10*** | (2026.01) |
| ***H10W 90/00*** | (2026.01) |

(52) U.S. Cl.

CPC ......... *H10W 40/47* (2026.01); *H10W 70/424* (2026.01); *H10W 74/111* (2026.01); *H10W 90/00* (2026.01); *H10W 90/756* (2026.01)

(58) Field of Classification Search

None

See application file for complete search history.

(56) References Cited

U.S. PATENT DOCUMENTS

2006/0096299 A1* 5/2006 Mamitsu ............... H01L 25/117 257/E23.098
2019/0067251 A1* 2/2019 Bando ................ H01L 23/4012

FOREIGN PATENT DOCUMENTS

| | | | |
|---|---|---|---|
| EP | 3147941 | A1 | 3/2017 |
| JP | 2005259748 | A | 9/2005 |
| JP | 2011060914 | A | 3/2011 |
| JP | 2011114157 | A | 6/2011 |
| JP | 2012104583 | A | 5/2012 |
| JP | 2012151328 | A | 8/2012 |
| JP | 2012222069 | A | 11/2012 |

OTHER PUBLICATIONS

Office Action issued for corresponding JP Patent Application No. 2022-113919, and its English translation, dated May 12, 2026.

* cited by examiner

*Primary Examiner* — Sue A Purvis
*Assistant Examiner* — Jordan M Klein
(74) *Attorney, Agent, or Firm* — Rabin & Berdo, P.C.

(57) ABSTRACT

A semiconductor device includes a first semiconductor unit that includes a first substrate including a first wiring board to which a first semiconductor chip is bonded, a second semiconductor unit that includes a second substrate including a second wiring board to which a second semiconductor chip is bonded, a cooling unit including a first cooling surface and a second cooling surface that are opposite to each other and respectively have the first semiconductor unit facing the first substrate thereon and the second semiconductor unit facing the second substrate thereon, and an output terminal provided at a first side of the cooling unit and being connected to both the first wiring board and the second wiring board.

13 Claims, 23 Drawing Sheets

SEMICONDUCTOR DEVICE

CROSS-REFERENCE TO RELATED APPLICATION

This application is based upon and claims the benefit of priority of the prior Japanese Patent Application No. 2022-113919, filed on Jul. 15, 2022, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices. As one example, such semiconductor devices include a power converter function. Power devices are semiconductor chips including insulated gate bipolar transistors (IGBTs) and power metal oxide semiconductor field effect transistors (MOSFETs). A semiconductor device includes a substrate on which semiconductor chips are mounted and a cooler with a top plate on which the substrate is mounted.

There is demand for miniaturization of semiconductor devices. One example of a miniaturization method is to reduce the mounting area of semiconductor chips on a substrate. However, there are limits on the miniaturization that may be achieved by this method. For this reason, as one example, a substrate including semiconductor chips is mounted not only on the top plate of a cooler but also on the bottom plate thereof opposite to the top plate (see, for example, Japanese Laid-open Patent Publication No. 2012-222069, Japanese Laid-open Patent Publication No. 2012-151328, Japanese Laid-open Patent Publication No. 2011-114157, Japanese Laid-open Patent Publication No. 2011-060914, Japanese Laid-open Patent Publication No. 2005-259748, and Japanese Laid-open Patent Publication No. 2012-104583).

When substrates provided with semiconductor chips are mounted on both the top plate and the bottom plate of a cooler, as one example, the substrate on the top plate side may be used as an upper arm portion and the substrate on the bottom plate side may be used as a lower arm portion. In this case, there is the issue of how to electrically connect the upper arm portion and the lower arm portion simply and easily.

SUMMARY OF THE INVENTION

According to an aspect, there is provided a semiconductor device including: a first semiconductor unit including a first semiconductor chip and a first substrate, the first substrate including, on a first main surface thereof, a first wiring board to which the first semiconductor chip is bonded; a second semiconductor unit including a second semiconductor chip and a second substrate, the second substrate including, on a second main surface thereof, a second wiring board to which the second semiconductor chip is bonded; a cooling unit having a first side in a plan view of the semiconductor device and including a first cooling surface and a second cooling surface that are opposite to each other and respectively have thereon the first semiconductor unit facing the first substrate and the second semiconductor unit facing the second substrate so that the cooling unit is sandwiched between the first and second semiconductor units; and an output terminal provided at the first side of the cooling unit and being connected to both the first wiring board and the second wiring board.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
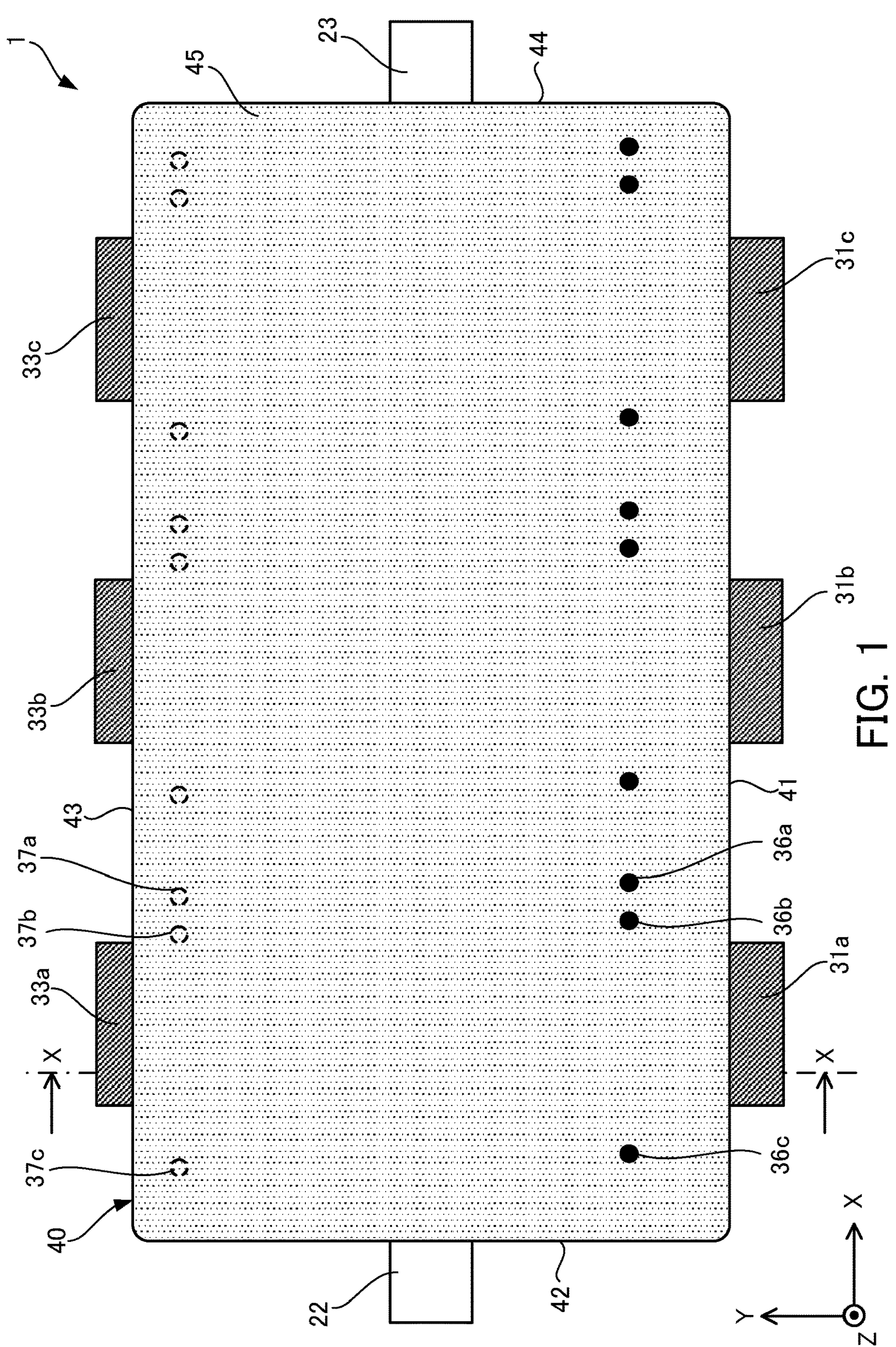
FIG. 1 is a plan view of a front surface of a semiconductor device according to a first embodiment.

Several embodiments will be described below with reference to the accompanying drawings. Note that in the following description, the expressions "front surface" and "upper surface" refer to an X-Y plane that faces upward (in the "+Z direction") for semiconductor devices 1 and 1*a* to 1*d* depicted in the drawings. In the same way, the expression "up" refers to the upward direction (or "+Z direction") for the semiconductor devices 1 and 1*a* to 1*d* depicted in the drawings. The expressions "rear surface" and "lower surface" refer to an X-Y plane that faces downward (that is, in the "−Z direction") for the semiconductor devices 1 and 1*a* to 1*d* depicted in the drawings. In the same way, the expression "down" refers to the downward direction (or "−Z direction") for the semiconductor devices 1 and 1*a* to 1*d* depicted in the drawings. These expressions are used as needed to refer to the same directions in the other drawings. The expression "high" refers to an upper (that is, "+Z side") position for the semiconductor devices 1 and 1*a* to 1*d* in the drawings. In the same way, the expression "low" refers to a lower (that is, "−Z side") position for the semiconductor devices 1 and 1*a* to 1*d* in the drawings. The expressions "front surface", "upper surface", "up", "rear surface", "lower surface", "down", and "side surface" are merely convenient expressions used to specify relative positional relationships, and are not intended to limit the technical scope of the present disclosure. As one example, "up" and "down" do not necessarily mean directions that are perpendicular to the ground. That is, the "up" and "down" directions are not limited to the direction of gravity. Additionally, in the following description, the expression "main component" refers to a component that composes 80% or higher by volume. The expression "substantially equal" may refer to a range that is within ±10%. Likewise, "perpendicular" and "parallel" may refer to a range of within ±10°.

First Embodiment

Figure 2:
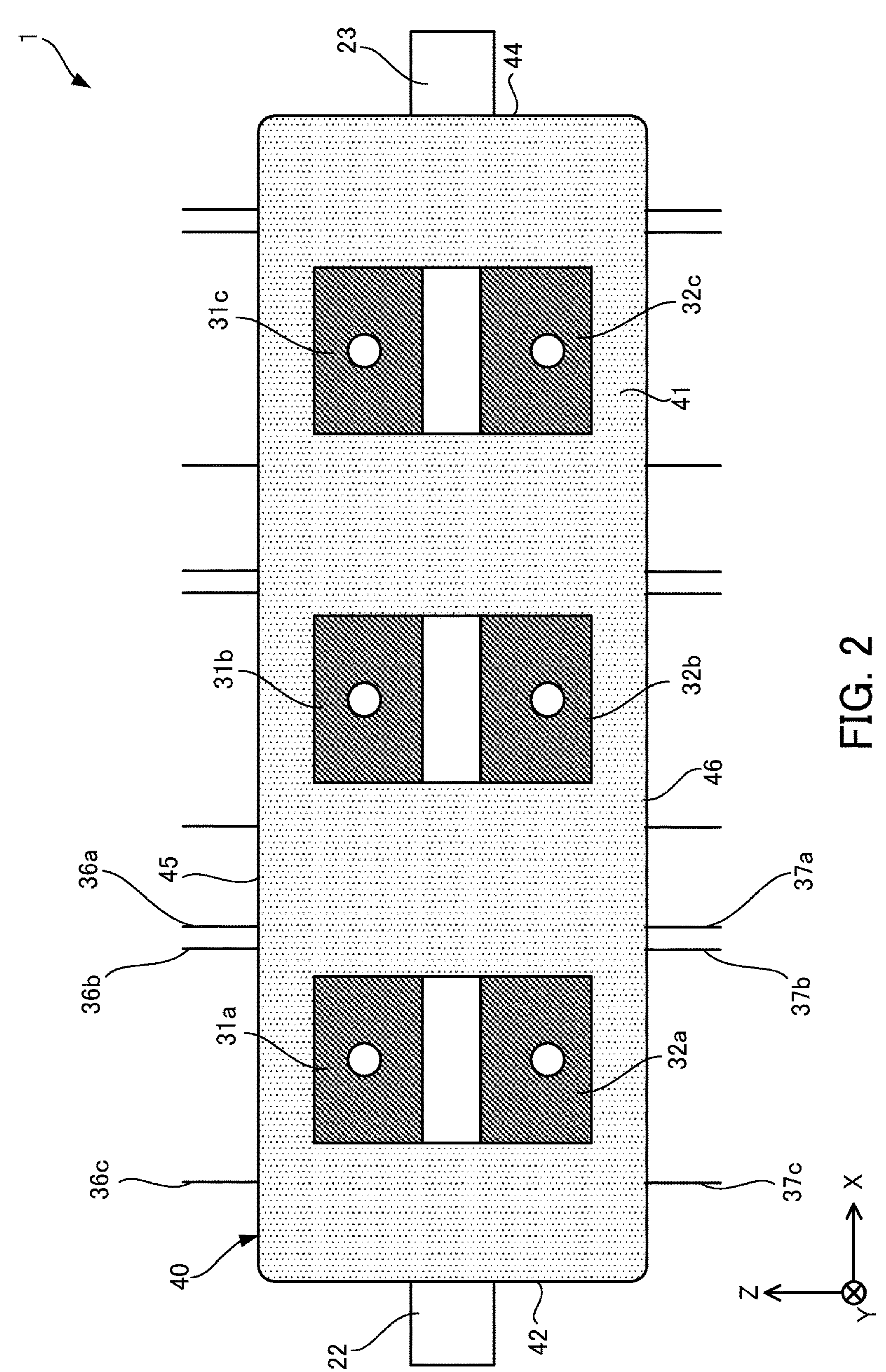
FIG. 2 is a side view (of a positive and negative terminal side) of the semiconductor device according to the first embodiment.
Figure 3:
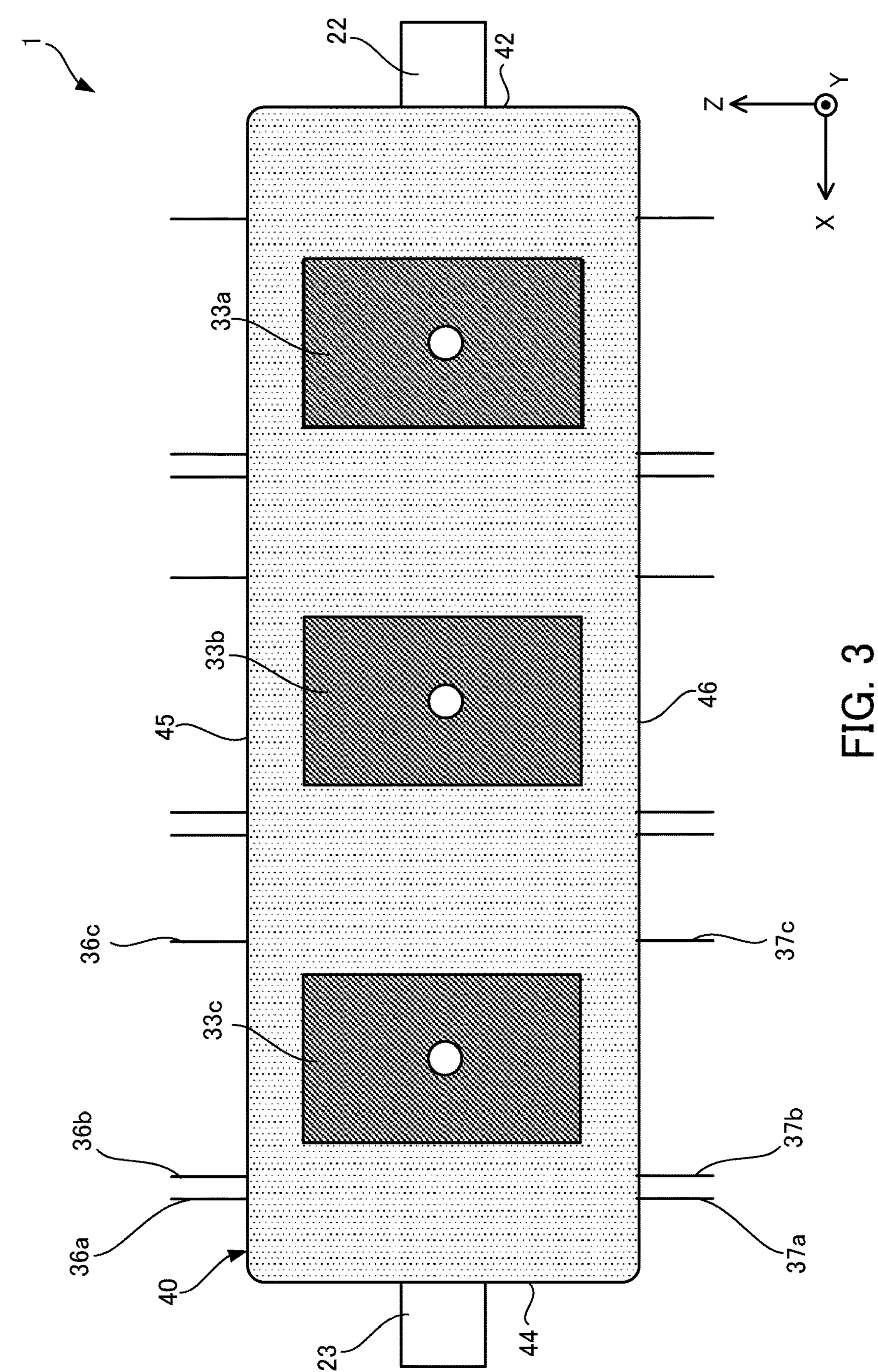
FIG. 3 is a side view (of an output terminal side) of the semiconductor device according to the first embodiment.
Figure 4:
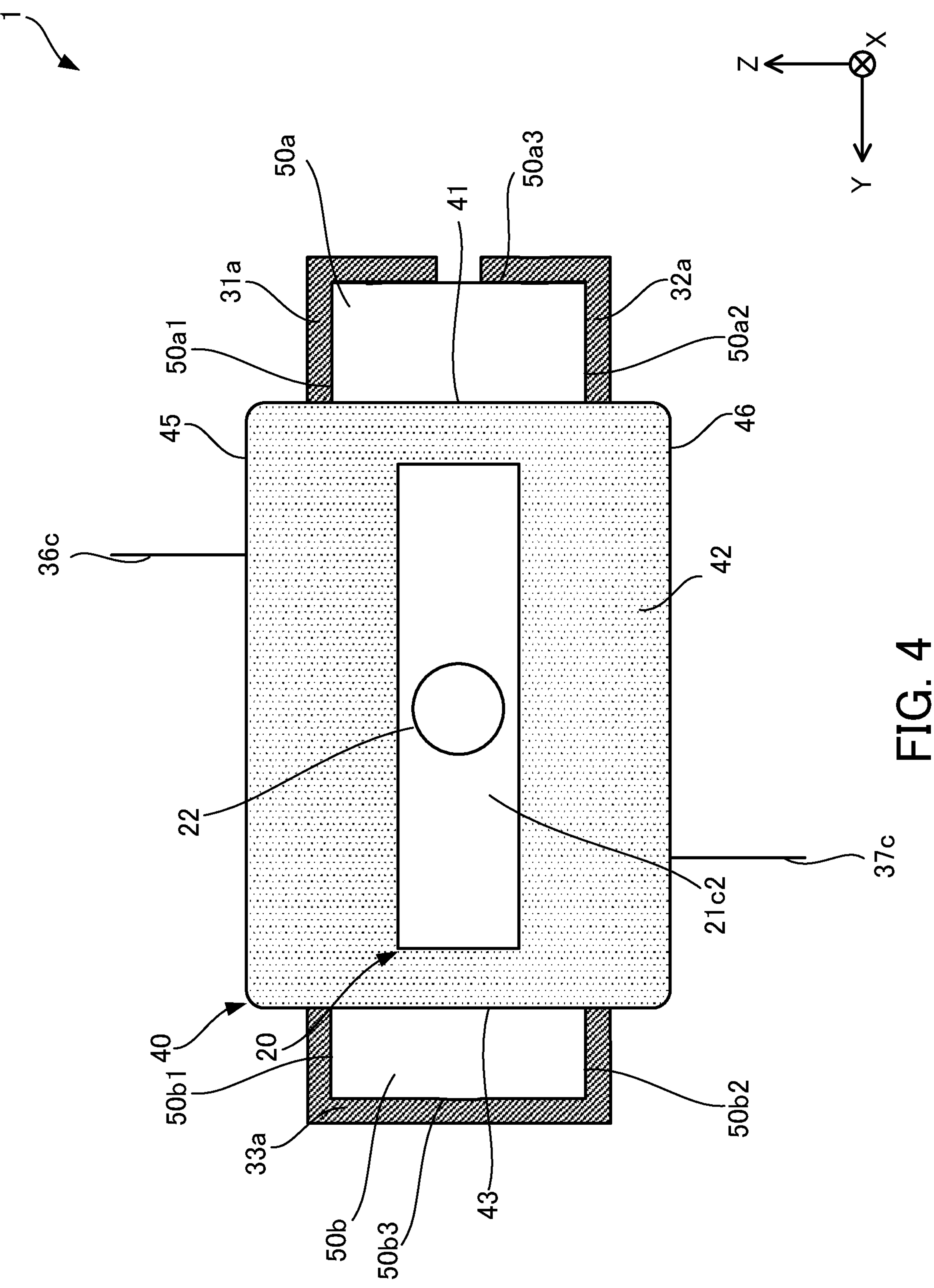
FIG. 4 is a side view of a short side surface of the semiconductor device according to the first embodiment.

First, the external appearance of a semiconductor device 1 according to the first embodiment will be described with reference to FIGS. 1 to 4. FIG. 1 is a plan view of a front surface of the semiconductor device according to the first embodiment. FIG. 2 is a side view (of a positive and negative terminal side) of the semiconductor device according to the first embodiment, and FIG. 3 is a side view (of an output terminal side) of the semiconductor device according to the first embodiment. FIG. 4 is a side view of a short side surface of the semiconductor device according to the first embodiment. Note that FIG. 2 is a side view depicting positive terminals 31*a*, 31*b*, and 31*c* and negative terminals 32*a*, 32*b*, and 32*c* of the semiconductor device 1 in FIG. 1 as viewed in the +Y direction. FIG. 3 is a side view depicting output terminals 33*a*, 33*b*, and 33*c* of the semiconductor device 1 in FIG. 1 as viewed in the −Y direction. FIG. 4 is a side view depicting a coolant pipe 22 of the semiconductor device 1 in FIG. 1 as viewed in the +X direction.

The semiconductor device 1 includes an encapsulating body 40, and an insulating jig (second insulating jig) 50*a* and an insulating jig (first insulating jig) 50*b*, positive terminals 31*a* to 31*c*, negative terminals 32*a* to 32*c*, and output terminals 33*a* to 33*c*, which are exposed from the encapsulating body 40. In addition, the semiconductor device 1 includes control terminals 36*a* and 37*a* and detection terminals 36*b*, 36*c*, 37*b* and 37*c*, which are all exposed from the encapsulating body 40. Note that in FIG. 1, locations on a front surface 45 that are opposite positions where the control terminals 37*a* and the detection terminals 37*b* and 37*c* are exposed on a rear surface 46 of the encapsulating body 40 are indicated by circles drawn with dashed lines.

The encapsulating body 40 encapsulates a cooling unit 20, described later, and semiconductor units 10*a* to 10*f*. Note that in the following description, the semiconductor units 10*a* to 10*f* are referred to as the "semiconductor units 10" when no distinction is made between them. The encapsulating body 40 is formed as a rectangular prism. The encapsulating body 40 includes a long side surface 41, a short side surface 42, a long side surface 43, and a short side surface 44, which surround the four sides in that order. In addition, the encapsulating body 40 includes the front surface 45 and the rear surface 46 that cover the upper and lower surfaces. Note that positions where the long side surface 41, the short side surface 42, the long side surface 43, and the short side surface 44 are joined may be chamfered into rounded shapes. Positions where the long side surface 41, the short side surface 42, the long side surface 43, the short side surface 44, the front surface 45, and the rear surface 46 are joined may also be chamfered into rounded shapes. Note that coolant pipes 22 and 23 of the cooling unit 20 (see FIG. 9) and side walls 21*c*2 and 21*c*4 thereof to which the coolant pipes 22 and 23 are connected are exposed from the short side surfaces 42 and 44 of the encapsulating body 40. FIG. 4 depicts how the side wall 21*c*2 and the coolant pipe 22 are exposed. Although not depicted, the side wall 21*c*4 is also exposed in the same way as in FIG. 4. Note that the encapsulating body 40 may encapsulate the side walls 21*c*2 and 21*c*4 of the cooling unit 20 while exposing the coolant pipes 22 and 23.

This encapsulating body 40 includes thermosetting resin and a filler contained within the thermosetting resin. Example thermosetting resins include epoxy resin, phenolic resin, and maleimide resin. The filler is silicon oxide, aluminum oxide, boron nitride, or aluminum nitride.

The insulating jigs 50*a* and 50*b* are made of an insulating material as a main component. Thermoplastic resin may be given as an example material. As examples, the thermoplastic resin is polyphenylene sulfide (PPS) resin, polybutylene terephthalate (PBT) resin, polybutylene succinate (PBS) resin, polyamide (PA) resin, or acrylonitrile butadiene styrene (ABS) resin. These insulating jigs 50*a* and 50*b* are formed as rectangular prisms, for example.

The insulating jigs 50*a* are respectively attached at three locations to a side wall 21*c*1 of the cooling unit 20 (on the long side surface 41 of the encapsulating body 40). The insulating jigs 50*a* protrude outward (in the −Y direction) from the long side surface 41 of the encapsulating body 40 that encapsulates the cooling unit 20 and the semiconductor units 10. When viewed from the side, the insulating jigs 50*a* each include an upper surface 50*a*1, a lower surface 50*a*2 opposite to the upper surface 50*a*1, and an outer surface 50*a*3 connecting the outer edges of the upper surface 50*a*1 and lower surface 50*a*2. The upper surface 50*a*1 faces the same direction as the top plate 21*a* (the front surface 45 of the encapsulating body 40) of the cooling unit 20. The lower surface 50*a*2 faces the same direction as the bottom plate 21*b* (the rear surface 46 of the encapsulating body 40) of the cooling unit 20. When viewed from above, the outer surface 50*a*3 is parallel to the side wall 21*c*1 (the long side surface 41 of the encapsulating body 40) of the cooling unit 20. The upper surfaces (first surface) **50*a*1 and parts of outer surfaces 50*a*3 of the insulating jigs 50*a* are covered by the positive terminals 31*a* to 31*c*. The lower surfaces (second surface) 50*a*2 and parts of the outer surfaces 50*a*3 of the insulating jigs 50*a* are covered by the negative terminals 32*a* to 32*c*. However, gaps are provided between the positive terminals 31*a* to 31*c* and the negative terminals 32*a* to 32*c* on the outer surfaces 50*a*3 of the insulating jigs 50*a*. That is, the upper surfaces 50*a*1 and the lower surfaces 50*a*2 of the insulating jigs 50*a* are sandwiched between the positive terminals 31*a* to 31*c* and the negative terminals 32*a* to 32*c***.

The insulating jigs **50*b* are attached at three locations on a side wall 21*c*3 of the cooling unit 20 (on the long side surface 43 of the encapsulating body 40). The insulating jigs 50*b* protrude outward (in the +Y direction) from the long side surface 43 of the encapsulating body 40 that encapsulates the cooling unit 20 and the semiconductor units 10. When viewed from the side, the insulating jigs 50*b* each include an upper surface 50*b*1, a lower surface 50*b*2 opposite to the upper surface 50*b*1, and an outer surface 50*b*3 connecting the outer edges of the upper surface 50*b*1 and lower surface 50*b*2. The upper surface 50*b*1 faces the same direction as the top plate 21*a* (the front surface 45 of the encapsulating body 40) of the cooling unit 20. The lower surface 50*b*2 faces the same direction as the bottom plate 21*b* (the rear surface 46 of the encapsulating body 40) of the cooling unit 20. When viewed from above, the outer surface 50*b*3 is parallel to the side wall 21*c*3 (the long side surface 43 of the encapsulating body 40) of the cooling unit 20. The insulating jigs 50*b* have upper surfaces 50*b*1, outer surfaces 50*b*3, and lower surfaces 50*b*2 that are covered by the output terminals 33*a* to 33*c***.

The positive terminals **31*a* to 31*c*, the negative terminals 32*a* to 32*c*, and the output terminals 33*a* to 33*c* are made of a metal with superior electrical conductivity. Examples of such metal are copper, copper alloy, aluminum, and aluminum alloy. A plating treatment may be performed to improve the corrosion resistance of the metal plates of the positive terminals 31*a* to 31*c*, the negative terminals 32*a* to 32*c*, and the output terminals 33*a* to 33*c***. When doing so, examples of the plating material used here are nickel, nickel-phosphorus alloy, and nickel-boron alloy.

First end portions of the positive terminals **31*a* to 31*c* are exposed on the long side surface 41 of the encapsulating body 40 along the length direction (the X direction). The first end portions of the positive terminals 31*a* to 31*c* are formed as flat plates that are L-shaped when viewed from the side in the ±X direction. The first end portions of the positive terminals 31*a* to 31*c* continuously cover the insulating jigs 50*a* along the upper surfaces 50*a*1 of the insulating jigs 50*a* and upper portions of the outer surfaces 50*a*3. Openings are formed in areas of the first end portions of the positive terminals 31*a* to 31*c* covering the outer surfaces 50*a*3 of the insulating jigs 50*a*. External terminals are connected to these openings. Openings (in which nuts are housed, for example) are also formed in the outer surfaces 50*a*3 of the insulating jigs 50*a*** so as to correspond to these openings.

First end portions of the negative terminals **32*a* to 32*c* are formed along the length direction (X direction) on the long side surface 41 of the encapsulating body 40 and are exposed so as to line up in the ±Z direction with the positive terminals 31*a* to 31*c*. The first end portions of the negative terminals 32*a* to 32*c* are formed as flat plates that are L-shaped when viewed from the side in the ±X direction. The first end portions of the negative terminals 32*a* to 32*c* continuously cover the insulating jigs 50*a* along the lower surfaces 50*a*2 of the insulating jigs 50*a* and lower portions of the outer surfaces 50*a*3. Openings are formed in areas of the first end portions of the negative terminals 32*a* to 32*c* covering the outer surfaces 50*a*3 of the insulating jigs 50*a*. External terminals are connected to these openings. Openings (in which nuts are housed, for example) are also formed in the outer surfaces 50*a*3 of the insulating jigs 50*a* so as to correspond to these openings. Accordingly, gaps are provided between the first end portions of the positive terminals 31*a* to 31*c* and the first end portions of the negative terminals 32*a* to 32*c* on the outer surfaces 50*a*3 of the insulating jigs 50*a***.

The output terminals **33*a* to 33*c* are exposed on the long side surface 43 of the encapsulating body 40 along the length direction (the X direction). The output terminals 33*a* to 33*c* are formed as flat plates that are U-shaped when viewed from the side in the ±X direction. The output terminals 33*a* to 33*c* cover the outside of the insulating jigs 50*b* along the upper surfaces 50*b*1, the outer surfaces 50*b*3, and the lower surfaces 50*b*2 of the insulating jigs 50*b*. Openings are formed in areas of the output terminals 33*a* to 33*c* covering the outer surfaces 50*b*3 of the insulating jigs 50*b*. External terminals are connected to these openings. Openings (in which nuts are housed, for example) are also formed in the outer surfaces 50*b*3 of the insulating jigs 50*b*** so as to correspond to these openings.

The control terminals **36*a* and 37*a* and the detection terminals 36*b*, 36*c*, 37*b*, and 37*c* are formed in column shapes, for example, and may be circular or rectangular in cross section. The control terminals 36*a* and 37*a* and the detection terminals 36*b*, 36*c*, 37*b*, and 37*c* are made of a metal with superior electrical conductivity. Example metals include copper, copper alloy, aluminum, and aluminum alloy. A plating treatment may be performed to improve the corrosion resistance of the metal plates of the control terminals 36*a* and 37*a* and the detection terminals 36*b*, 36*c*, 37*b*, and 37*c***. When doing so, examples of the plating material used here are nickel, nickel-phosphorus alloy, and nickel-boron alloy.

There are three sets each of a control terminal **36*a* and detection terminals 36*b* and 36*c* that extend vertically upward (in the +Z direction) from the front surface 45 of the encapsulating body 40. The detection terminal 36*c* is provided closest to the short side surface 42, and the detection terminal 36*b* is provided on the short side surface 44 side of the detection terminal 36*c*. The detection terminals 36*b* and 36*c* are provided so as to be separated by a distance corresponding to the widths of the positive terminals 31*a* to 31*c*. The control terminal 36*a* is provided adjacent to the detection terminal 36*b* and on the short side surface 44 side of the detection terminal 36*b***.

There are three sets each of a control terminal **37*a* and detection terminals 37*b* and 37*c* that extend vertically downward (in the −Z direction) from the rear surface 46 of the encapsulating body 40 (in FIG. 1, the circles drawn with broken lines indicate positions on the front surface 45 of the control terminals 37*a* and the detection terminals 37*b* and 37*c*). The detection terminal 37*c* is provided on the short side surface 42 side, and the detection terminal 37*b* is provided on the short side surface 44 side of the detection terminal 37*c*. The detection terminals 37*b* and 37*c* are provided so as to be separated by a distance corresponding to the widths of the output terminals 33*a* to 33*c*. The control terminal 37*a* is provided adjacent to the detection terminal 37*b* and on the short side surface 44 side of the detection terminal 37*b***.

Figure 5:
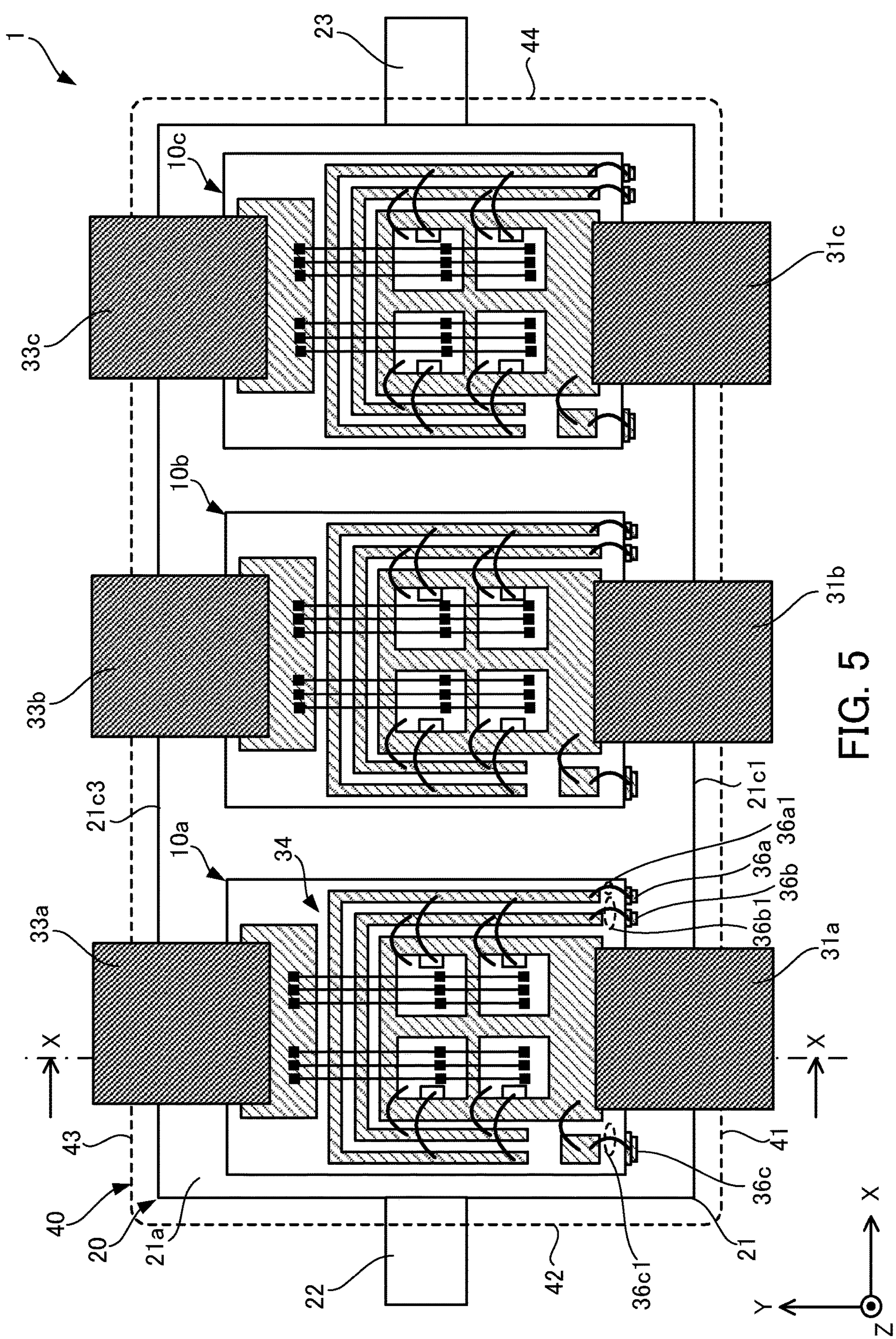
FIG. 5 is a plan view of a front surface of the semiconductor device according to the first embodiment.
Figure 6:
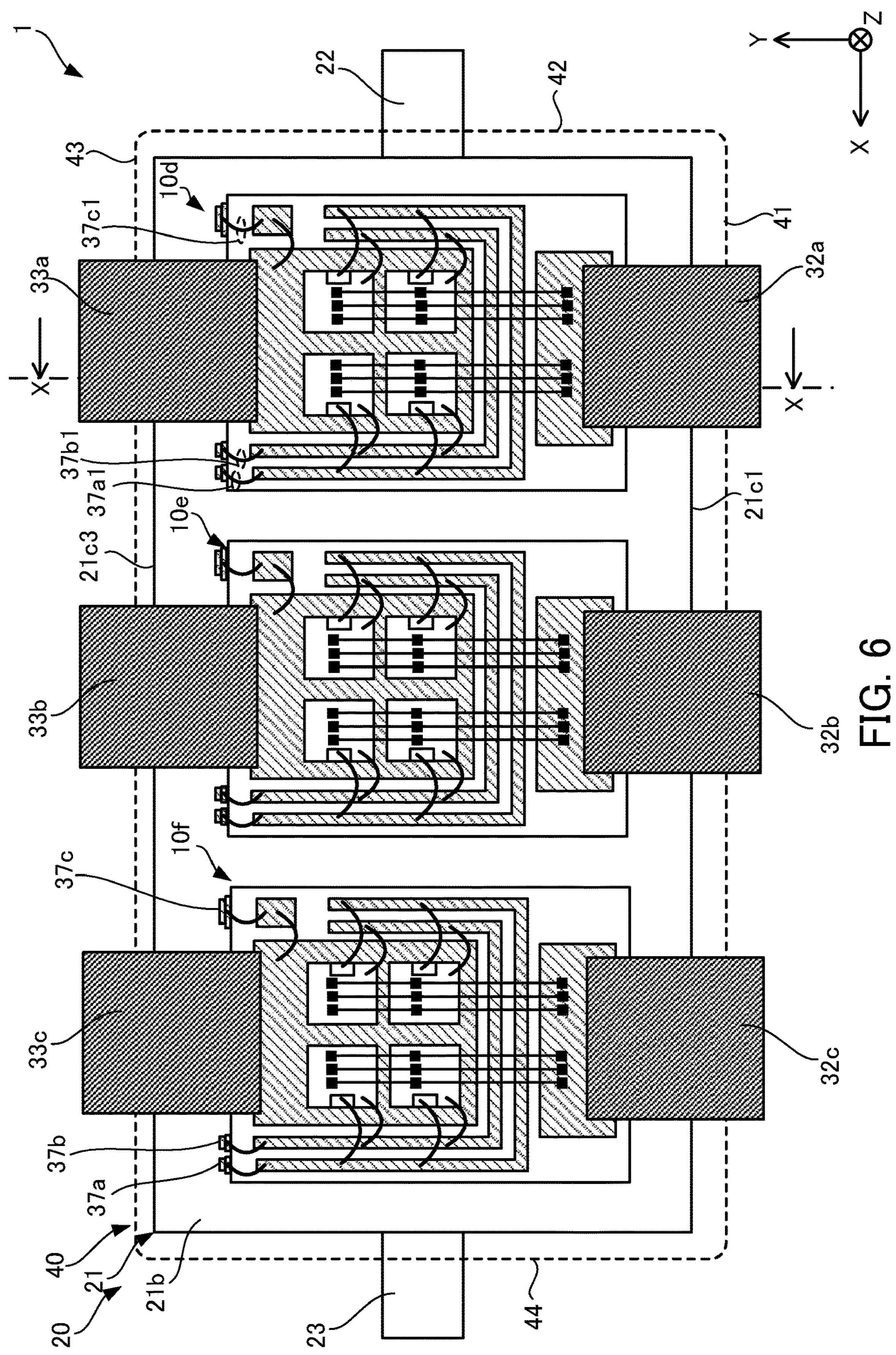
FIG. 6 is a plan view of a rear surface of the semiconductor device according to the first embodiment.
Figure 7:
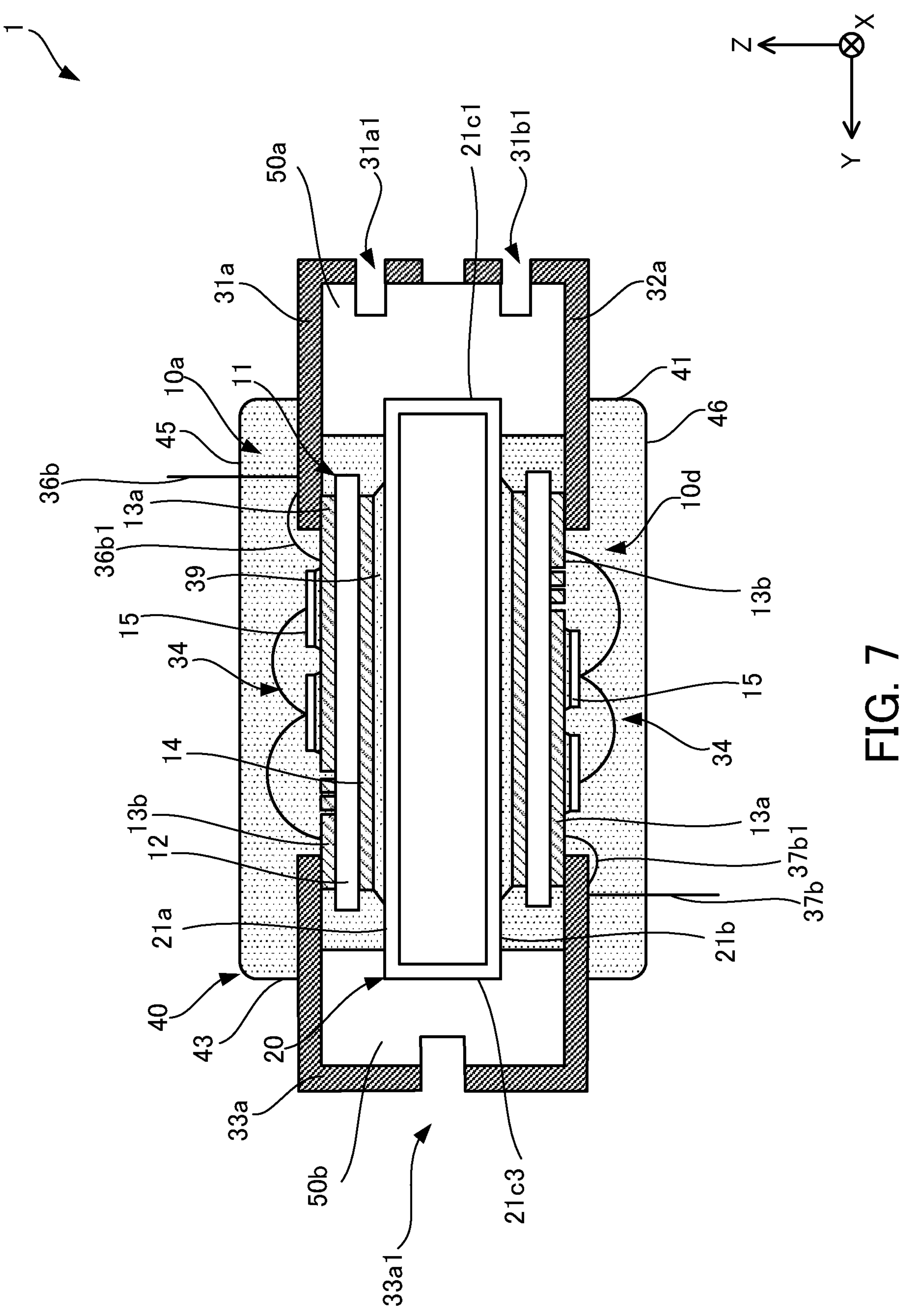
FIG. 7 is a cross-sectional view of the semiconductor device according to the first embodiment.
Figure 8:
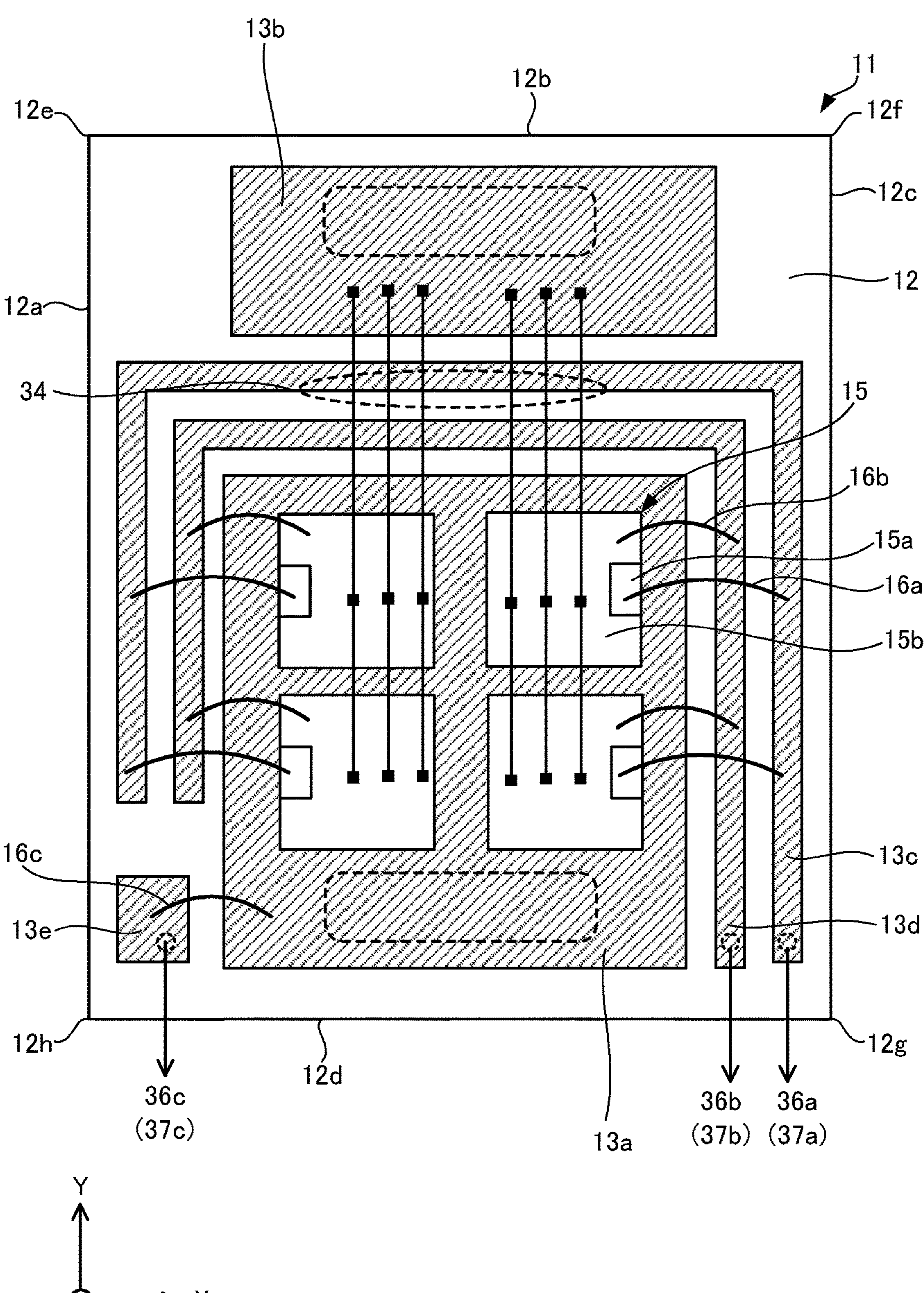
FIG. 8 is a plan view of an insulated circuit board included in the semiconductor device according to the first embodiment.
Figure 9:
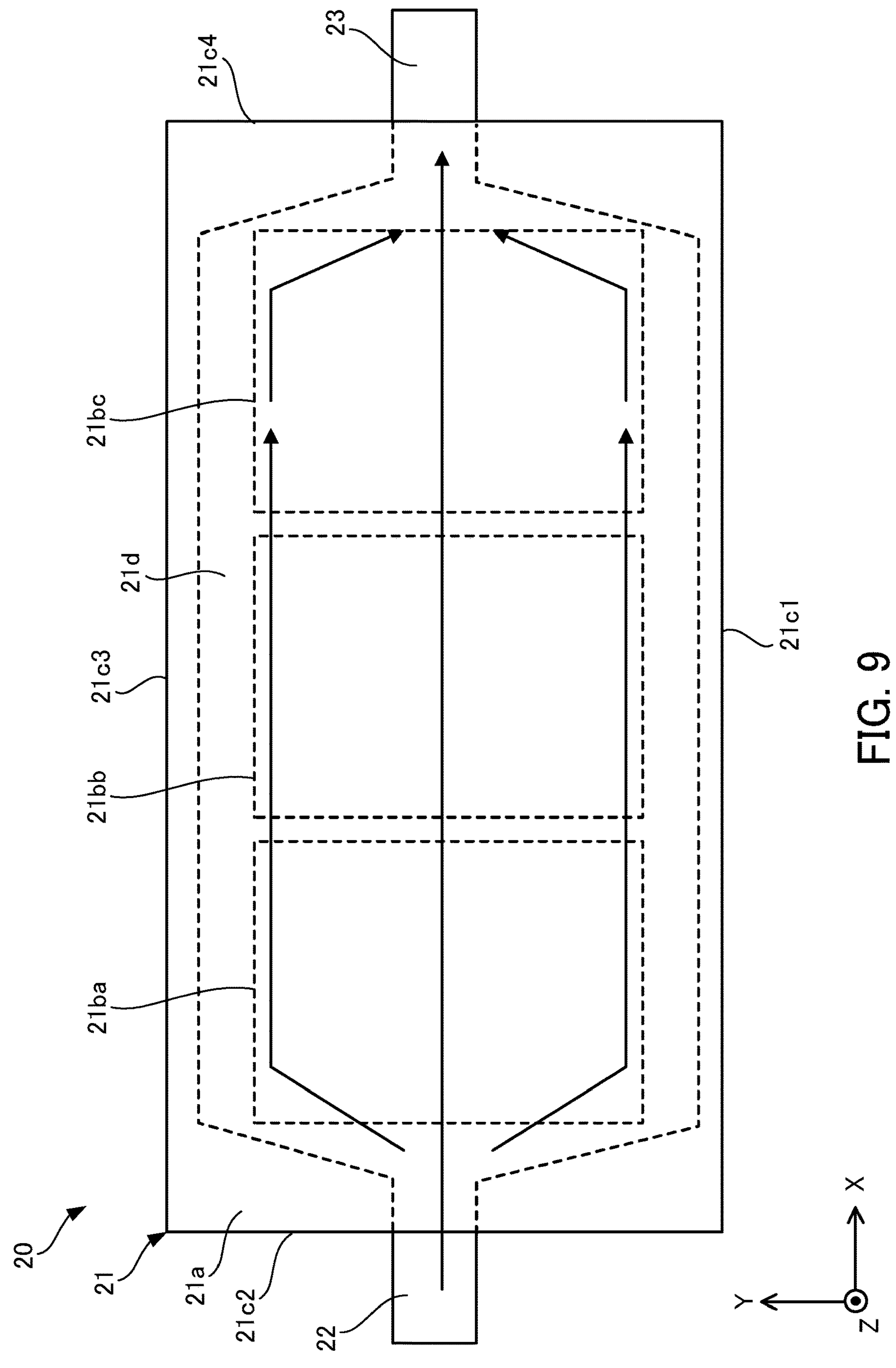
FIG. 9 is a plan view of a cooling unit included in the semiconductor device according to the first embodiment.

Next, the configuration of the semiconductor device 1 encapsulated by the encapsulating body 40 will be described with reference to FIGS. 5 to 9. FIG. 5 is a plan view of the front surface of the semiconductor device according to the first embodiment, and FIG. 6 is a plan view of the rear surface of the semiconductor device according to the first embodiment. FIG. 7 is a cross-sectional view of the semiconductor device according to the first embodiment. FIG. 8 is a plan view of an insulated circuit board included in the semiconductor device according to the first embodiment. FIG. 9 is a plan view of a cooling unit included in the semiconductor device according to the first embodiment. Note that FIGS. 5 and 6 depict the front and rear surfaces, respectively, of the semiconductor device 1 excluding the encapsulating body 40, the control terminals 36*a* and 37*a*, and the detection terminals 36*b*, 36*c*, 37*b* and 37*c*. In these drawings, the external form of the encapsulating body 40 is indicated by broken lines. FIG. 7 is a cross-sectional view taken along the dot-dash line X-X in FIGS. 5 and 6.

In addition to the positive terminals 31*a* to 31*c*, the negative terminals 32*a* to 32*c*, the output terminals 33*a* to 33*c*, the control terminals 36*a* and 37*a*, and the detection terminals 36*b*, 36*c*, 37*b*, and 37*c* described earlier, the semiconductor device 1 includes the main current wiring 34, as well as the semiconductor units 10*a* to 10*f* and the cooling unit 20 on which the semiconductor units 10*a* to 10*f* are disposed. These components are encapsulated by the encapsulating body 40.

The semiconductor units 10*a* to 10*c* are disposed in a line on a top plate 21*a* of the cooling unit 20 along the length direction (that is, the X direction). The semiconductor unit 10*a* may be provided as a second semiconductor unit, and the semiconductor unit 10*d* may be provided as a first semiconductor unit. The semiconductor units 10*d* to 10*f* are disposed in a line on a bottom plate 21*b* of the cooling unit 20 along the length direction (that is, the X direction). With this configuration, the semiconductor units 10*a* to 10*c* are disposed so that the wiring boards 13*a* and 13*b* of the insulated circuit boards 11, described later, included in the semiconductor units 10*a* to 10*c* face the long side surfaces 41 and 43 of the encapsulating body 40 (that is, the side walls 21*c*1 and 21*c*3 of the cooling unit 20). The semiconductor units 10*d* to 10*f* are disposed so that the wiring boards 13*a* and 13*b* of the insulated circuit boards 11 (described later) included in the semiconductor units 10*d* to 10*f* face the long side surfaces 43 and 41 of the encapsulating body 40 (that is, the side walls 21*c*3 and 21*c*1 of the cooling unit 20). These semiconductor units 10 are bonded to the top plate 21*a* and the bottom plate 21*b* of the cooling unit 20 via bonding members 39.

Each semiconductor unit 10 includes an insulated circuit board 11 (whose front surface is depicted in FIG. 8) and semiconductor chips 15. The insulated circuit board 11 is rectangular when viewed from above. The insulated circuit board 11 has an insulating board 12, a wiring portion including a plurality of wiring boards 13*a* to 13*e* formed on a front surface of the insulating board 12, and a metal plate 14 formed on a rear surface of the insulating board 12. The outer forms of the plurality of wiring boards 13*a* to 13*e* and the metal plate 14 are smaller than the insulating board 12 when looking from above and are formed inside the insulating board 12. Note that the shapes, number, and sizes of the plurality of wiring boards 13*a* to 13*e* are mere examples. Also, the plurality of wiring boards 13*a* to 13*e* are collectively referred to as the "wiring portion".

The insulating board 12 is rectangular when viewed from above. Corner portions of the insulating board 12 may be chamfered. As examples, the corner portions may be chamfered into rounded or beveled shapes. The insulating board 12 is surrounded on all four sides by a long side 12*a*, a short side 12*b*, a long side 12*c*, and a short side 12*d* as the outer circumferential sides. The insulating board 12 also includes corner portions 12*e* to 12*h*. The corner portion 12*e* is formed by the long side 12*a* and the short side 12*b*. The corner portion 12*f* is formed by the short side 12*b* and the long side 12*c*. The corner portion 12*g* is formed by the long side 12*c* and the short side 12*d*. The corner portion 12*h* is formed by the short side 12*d* and the long side 12*a*. This insulating board 12 is made of a ceramic with favorable thermal conductivity. Example ceramics are made of a material with aluminum oxide, aluminum nitride, or silicon nitride as a main component. The thickness of the insulating board 12 is 0.2 mm or more and 2.0 mm or less.

The metal plate 14 is rectangular when viewed from above. Corner portions may be chamfered into rounded or beveled shapes, for example. The metal plate 14 is smaller in size than the insulating board 12 and is formed on the entire rear surface of the insulating board 12 except for edge portions. The metal plate 14 is made of a metal with superior thermal conductivity as a main component. Example metals include copper, aluminum, and an alloy including at least one of these metals. The thickness of the metal plate 14 is 0.1 mm or more and 2.0 mm or less. A plating treatment may be performed to improve the corrosion resistance of the metal plate. When doing so, examples of the plating material used are nickel, nickel-phosphorus alloy, and nickel-boron alloy.

The wiring boards 13*a* to 13*e* are formed across the entire surface of the insulating board 12 except for edge portions. When looking above, it is preferable for end portions of the wiring boards 13*a* to 13*e* that face the outer periphery of the insulating board 12 to coincide with end portions of the metal plate 14 on the outer peripheral sides of insulating board 12. This means that a favorable balance in stress is maintained between the insulated circuit board 11 and the metal plate 14 on the rear surface of the insulating board 12. By doing so, damage, such as excessive warping and cracking of the insulating board 12, is suppressed. Note that the two regions indicated with broken lines on the wiring boards 13*a* and 13*b* in FIG. 8 are regions where the positive terminals 31*a* to 31*c*, the negative terminals 32*a* to 32*c*, and the output terminals 33*a* to 33*c* are disposed. The thickness of the wiring boards 13*a* to 13*e* is 0.1 mm or more and 2.0 mm or less, for example. The wiring boards 13*a* to 13*e* are made of a metal with superior electrical conductivity. Example metals are copper, aluminum, or an alloy containing at least one of these metals. A plating treatment may also be performed on the surfaces of the wiring boards 13*a* to 13*e* to improve corrosion resistance. When doing so, the plating material used is nickel, nickel-phosphorus alloy, or nickel-boron alloy, for example.

The wiring board 13*a* (or "input wiring") is formed so as to extend from the short side 12*d* of the insulating board 12 toward the short side 12*b*. The wiring board 13*a* is rectangular when viewed from above. A gap is provided between an end portion in the +Y direction of the wiring board 13*a* and the short side 12*b* of the insulating board 12. Gaps are provided between end portions of the wiring board 13*a* in the +X direction and the long sides 12*a* and 12*c* of the insulating board 12.

The wiring board 13*b* (or "output wiring") is formed so as to extend from the short side 12*b* of the insulating board 12 toward the short side 12*d*. The wiring board 13*b* is rectangular when viewed from above. The widths of the wiring boards 13*a* and 13*b* in the ±X direction are substantially equal. The wiring boards 13*a* and 13*b* are arranged in a straight line in the ±Y direction. A gap is provided between the wiring board 13*b* and the wiring board 13*a*. Gaps are also provided between the end portions of the wiring board 13*b* in the ±X direction and the long sides 12*a* and 12*c* of the insulating board 12.

The wiring board 13*c* (or "control wiring") is U-shaped when looking from above. The wiring board 13*c* extends from near the corner portion 12*g* along the long side 12*c* toward the short side 12*b*, and turns toward the long side 12*a* at a position just before the wiring board 13*b*. The wiring board 13*c* extends along the short side 12*b* toward the long side 12*a* and turns toward the short side 12*d* at a position just before the long side 12*a*. The wiring board 13*c* extends along the long side 12*a* toward the short side 12*d* to a position just before the wiring board 13*e*.

The wiring board 13*d* (or "detection wiring") is also U-shaped when viewed from above. The wiring board 13*d* is formed between the wiring boards 13*c* and 13*a*. The wiring board 13*d* extends from near the corner portion 12*g* along the long side 12*c* toward the short side 12*b*, and turns toward the long side 12*a* at a position just before the wiring board 13*c*. The wiring board 13*d* extends along the short side 12*b* toward the long side 12*a* and turns toward the short side 12*d* at a position just before the wiring board 13*c*. The wiring board 13*d* extends along the long side 12*a* toward the short side 12*d* to a position just before the wiring board 13*e*.

The wiring board 13*e* (or "detection wiring") is rectangular when viewed from above. The wiring board 13*e* is formed near the corner portion 12*h* of the insulating board 12. The wiring board 13*e* is formed at a distance in the −Y direction from the end portions of the wiring boards 13*c* and 13*d*.

As examples of the insulated circuit board 11 with the configuration described above, it is possible to use a direct copper bonding (DCB) substrate or an active metal brazed (AMB) substrate. The insulated circuit board 11 transfers heat generated by the semiconductor chips 15, described later, via the wiring board 13*a*, the insulating board 12, and the metal plate 14, to the rear surface side of the insulated circuit board 11 to dissipate the heat.

Each semiconductor unit 10 also includes control wires 16*a* and detection wires 16*b* and 16*c*. The control wires 16*a* connect the control electrodes 15*a* of the respective semiconductor chips 15 and the wiring board 13*c*. That is, the control wires 16*a* extend from the control electrode 15*a* of each semiconductor chip 15 toward the outside (that is, toward the long sides 12*a* and 12*c*) and are connected to the wiring board 13*c*.

The detection wires 16*b* connect the output electrodes 15*b* of the semiconductor chips 15 and the wiring board 13*d*. That is, the detection wires 16*b* extend from the output electrodes 15*b* of the respective semiconductor chips 15 toward the outside (that is, toward the long sides 12*a* and 12*c*) and are connected to the wiring board 13*d*. The detection wire 16*c* connects the wiring boards 13*a* and 13*e*. The control wires 16*a* and the detection wires 16*b* and 16*c* are made of a material with superior electrical conductivity as a main component. Example materials include gold, copper, aluminum, or an alloy containing at least one of these metals.

The positive terminals 31*a* to 31*c* and the output terminals 33*a* to 33*c* are bonded to the wiring boards 13*a* and 13*b* respectively of the insulated circuit boards 11 included in the semiconductor units 10*a* to 10*c* (see FIG. 5). The main current wiring 34 connects the wiring board 13*b* and the output electrodes 15*b* (described later) of the semiconductor chips 15. The main current wiring 34 will be described in detail later.

In addition, the semiconductor units 10*a* to 10*c* each include a control terminal 36*a* and detection terminals 36*b* and 36*c* (see FIG. 2). A lower end portion of the control terminal 36*a* is connected by a wire 36*a*1 (see FIG. 5) to an end portion (in the vicinity of the corner portion 12*g*) of the wiring board 13*c* (indicated by the circle drawn with a broken line in FIG. 8). An upper end portion of the control terminal 36*a* extends vertically upward and protrudes outward from the front surface 45 of the encapsulating body 40 (see FIG. 3). Lower end portions of the detection terminals 36*b* and 36*c* are connected by wires 36*b*1 and 36*c*1 (see FIG. 5) to end portions (on the short side 12*d* side) of the wiring boards 13*d* and 13*e* (indicated by circles drawn with broken lines in FIG. 8). Upper end portions of the detection terminals 36*b* and 36*c* extend vertically upward and protrude outward from the front surface 45 of the encapsulating body 40 (see FIG. 3). Note that the wires 36*a*1, 36*b*1, and 36*c*1 also have a material with superior electrical conductivity as a main component. Example materials include gold, copper, aluminum, or an alloy containing at least one of these metals.

The negative terminals 32*a* to 32*c* and the output terminals 33*a* to 33*c* are bonded to the wiring boards 13*b* and 13*a* respectively of the insulated circuit boards 11 included in the semiconductor units 10*d* to 10*f* (see FIG. 6). The output terminals 33*a* to 33*c* connect the wiring boards 13*b* of the semiconductor units 10*a* to 10*c* and the wiring boards 13*a* of the semiconductor units 10*d* to 10*f* respectively on the side wall 21*c*3 side of the cooling unit. The main current wiring 34 connects the wiring board 13*b* and the output electrodes 15*b* (described later) of the semiconductor chips 15.

In addition, the semiconductor units 10*d* to 10*f* each include a control terminal 37*a* and detection terminals 37*b* and 37*c* (see FIG. 2). A lower end portion of the control terminal 37*a* is connected by a wire 37*a*1 (see FIG. 6) to an end portion (in the vicinity of the corner portion 12*g*) of the wiring board 13*c* (indicated by the circle drawn with a broken line in FIG. 8). An upper end portion of the control terminal 37*a* extends vertically downward and protrudes outward from the rear surface 46 of the encapsulating body 40 (see FIG. 3). Lower end portions of the detection terminals 37*b* and 37*c* are connected by wires 37*b*1 and 37*c*1 (see FIG. 6) to end portions (on the short side 12*d* side) of the wiring boards 13*d* and 13*e* (indicated by the circles drawn with broken lines in FIG. 8). Upper end portions of the detection terminals 37*b* and 37*c* extend vertically upward and protrude outward from the front surface 45 of the encapsulating body 40 (see FIG. 3). Note that the wires 37*a*1, 37*b*1, and 37*c*1 also have a material with superior electrical conductivity as a main component. Example materials include gold, copper, aluminum, or an alloy containing at least one of these metals.

In this example, the positive terminals 31*a* to 31*c* and the negative terminals 32*a* to 32*c* are plate-like and formed in L shapes. Note that FIG. 7 depicts the positive terminal 31*a* and the negative terminal 32*b*. The output terminals 33*a* to 33*c* are plate-like and formed in U shapes. Note that FIG. 7 depicts the output terminal 33*a*.

The main current wiring 34 is made of a metal with superior electrical conductivity. Example metals include copper, copper alloy, aluminum, and aluminum alloy. The main current wiring 34 may be wires or a lead frame, for example. In this example, the main current wiring 34 is illustrated as wires. As depicted in FIG. 8, the main current wiring 34 directly connects the output electrodes 15*b* on the front surfaces of two semiconductor chips 15 and the wiring board 13*b* along the ±Y direction.

The control terminals 36*a* and 37*a* and the detection terminals 36*b*, 36*c*, 37*b*, and 37*c* are also made of a metal with superior electrical conductivity. Example metals include copper, copper alloy, aluminum, and aluminum alloy. Surfaces of the cooling unit 20 may be subjected to a plating process to improve corrosion resistance of the control terminals 36*a* and 37*a* and the detection terminals 36*b*, 36*c*, 37*b* and 37*c*. When doing so, the plating material used is nickel, nickel-phosphorus alloy, or nickel-boron alloy, for example. These control terminals 36*a* and 37*a* and detection terminals 36*b*, 36*c*, 37*b*, and 37*c* may be shaped as columns or stripes, for example. Such column shapes may be circular or rectangular in cross section. The control terminals 36*a* and 37*a* and the detection terminals 36*b*, 36*c*, 37*b*, and 37*c* may be bonded to the wiring boards 13*c*, 13*d*, and 13*e* by the bonding members 39 described earlier.

The semiconductor chips 15 are power devices made of silicon carbide. One example of a power device is a power MOSFET. Such semiconductor chips 15 are provided with a drain electrode as an input electrode on a rear surface and a gate electrode as the control electrode 15*a* and a source electrode as the output electrode 15*b* on a front surface.

The semiconductor chips 15 may also be power devices made of silicon. In this case, the power device is an RC (Reverse Conducting)-IGBT, for example. An RC-IGBT is constructed by combining an IGBT as a switching element and an FWD (Free Wheeling Diode) as a diode element in a single chip. As one example, this type of semiconductor chip 15 is provided with a collector electrode as an input electrode on a rear surface, and a gate electrode as a control electrode and an emitter electrode as an output electrode on a front surface.

Note that in the present embodiment, a plurality of semiconductor chips 15 are disposed on the wiring board 13*a* via the bonding member 39 described earlier. In the present embodiment, a configuration where the semiconductor chips 15 are disposed in two rows and two columns on the wiring board 13*a* is depicted. In this case, each semiconductor chip 15 is disposed with the control electrode 15*a* facing outward (that is, facing the long side 12*a* or 12*c* of the insulating board 12).

The cooling unit 20 included in the semiconductor device 1 includes a cooler body 21 and coolant pipes 22 and 23 that communicate with the inside of the cooler body 21. Note that the top plate 21*a* side of the cooling unit 20 is depicted in FIG. 9. The cooling unit 20 may further include a pump and a heat dissipating device (or "radiator"). The pump is connected to the coolant pipes 22 and 23. The cooler body 21 includes the top plate 21*a*, the bottom plate 21*b*, and the side walls 21*c*1 to 21*c*4.

The cooler body 21 internally includes a cooling region 21*d* defined by the side walls 21*c*1 to 21*c*4. Note that FIG. 9 depicts the cooling region 21*d* with broken lines. The top plate 21*a* is a cooling surface that covers an upper surface of the cooling region 21*d*. Note that mounting regions 21*ba* to 21*bc*, indicated in FIG. 9 by broken lines, where the semiconductor units 10*a* to 10*c* are to be mounted are set on the top plate 21*a*. These mounting regions 21*ba* to 21*bc* are set in a line along the length direction (that is, the X direction) on the top plate 21*a*.

The bottom plate 21*b* is a cooling surface that is provided opposite the top plate 21*a* and covers a lower surface of the cooling region 21*d*. Note that mounting regions (not illustrated) where the semiconductor units 10*d* to 10*f* are to be mounted are also set on the bottom plate 21*b*. These mounting regions are set in a line along the length direction (that is, the X direction) on the bottom plate 21*b*.

Note that a plurality of radiator fins (not illustrated) are formed on the rear surface of the top plate 21*a*. This plurality of radiator fins may extend so as to connect the bottom plate 21*b* and the cooling region 21*d* on the rear surface of the top plate 21*a* (that is, the surface that faces the bottom plate 21*b*).

The side walls 21*c*1 to 21*c*4 surround the four sides of the cooling region 21*d*. Positions where the side walls 21*cl* to 21*c*4 are joined may be chamfered into rounded shapes. Positions where the top plate 21*a* and the side walls 21*c*1 to 21*c*4 are joined may also be chamfered into rounded shapes. Similarly, positions where the bottom plate 21*b* and the side walls 21*c*1 to 21*c*4 are joined may also be chamfered into rounded shapes. Note that as described later, insulated circuit boards 11 are disposed on the top plate 21*a* with the wiring boards 13*b* facing the side wall 21*c*3 (or "first side"). Insulated circuit boards 11 are disposed on the bottom plate 21*b* with the wiring boards 13*a* facing the side wall 21*c*3 (or "first side"). The output terminals 33*a* to 33*c* provided on the side wall 21*c*3 side (or "first side") are then electrically connected to the wiring boards 13*b* included in the insulated circuit boards 11 on the top plate 21*a* and the wiring boards 13*a* included in the insulated circuit boards 11 on the bottom plate 21*b*.

The coolant pipes 22 and 23 are formed in central parts of the side walls 21*c*2 and 21*c*4, respectively, of the cooler body 21. The coolant pipes 22 and 23 communicate with the cooling region 21*d* of the cooler body 21. The pump connected to the coolant pipes 22 and 23 circulate a coolant by introducing the coolant into the coolant pipe 22 and introducing coolant that has flowed out of the coolant pipe 23 back into the coolant pipe 22. Note that in FIG. 9, coolant flows are indicated by solid arrows. The heat dissipation device dissipates the heat in the coolant that has received heat transferred from the semiconductor units 10 to the outside. Note that as examples of the coolant, water, antifreeze (an aqueous solution of ethylene glycol), or long-life coolant (LLC) may be used. Note that the attachment positions of the coolant pipes 22 and 23 are mere examples. As one example, the coolant pipes 22 and 23 may be attached to the side wall 21*c*2. In this case, the coolant may be introduced from the coolant pipe 22, flow through the cooling region 21*d* in a U-shape, and flow out from the coolant pipe 23.

This cooling unit 20 is made of a metal with superior thermal conductivity as a main component. Example metals are copper, aluminum, or an alloy containing at least one of these metals. Surfaces of the cooling unit 20 may be subjected to a plating treatment to improve corrosion resistance of the cooling unit 20. When doing so, examples of the plating material used include nickel, nickel-phosphorus alloy, and nickel-boron alloy. The top plate 21*a* on which a plurality of radiator fins are formed is formed by forging or casting (die casting), for example. When forging is performed, a top plate 21*a* on which a plurality of radiator fins and the side walls 21*c*1 to 21*c*4 have been formed is obtained by applying pressure to a block-shaped member with the metal described above as a main component using a mold to cause plastic deformation of the member. When die casting is performed, molten die cast material is poured into a predetermined mold, is allowed to cool, and then removed from the mold to obtain a top plate 21*a* on which a plurality of radiator fins and the side walls 21*c*1 to 21*c*4 have been formed. One example of the die-cast material used here is an aluminum-based alloy. Alternatively, a top plate 21*a* on which the plurality of radiator fins and the side walls 21*c*1 to 21*c*4 have been formed may be formed by cutting a block-shaped member that has the metal described above as a main component.

Solder or sintered material is used for the bonding member 39 used to bond the semiconductor chips 15 and the insulated circuit boards 11 and to bond the semiconductor units 10 (that is, the insulated circuit boards 11) and the cooling unit 20. Lead-free solder or leaded solder is used as the solder. Lead-free solder has an alloy containing at least two of tin, silver, copper, zinc, antimony, indium, and bismuth, for example, as a main component. In addition, the solder may contain additives. Example additives are nickel, germanium, cobalt, and silicon. Including additives in the solder improves wettability, gloss, and bonding strength, which improves reliability. Leaded solder additionally contains lead. As one example, the sintered material is a metal material containing at least one of copper, copper alloy, nickel, nickel alloy, silver, and silver alloy.

Figure 10:
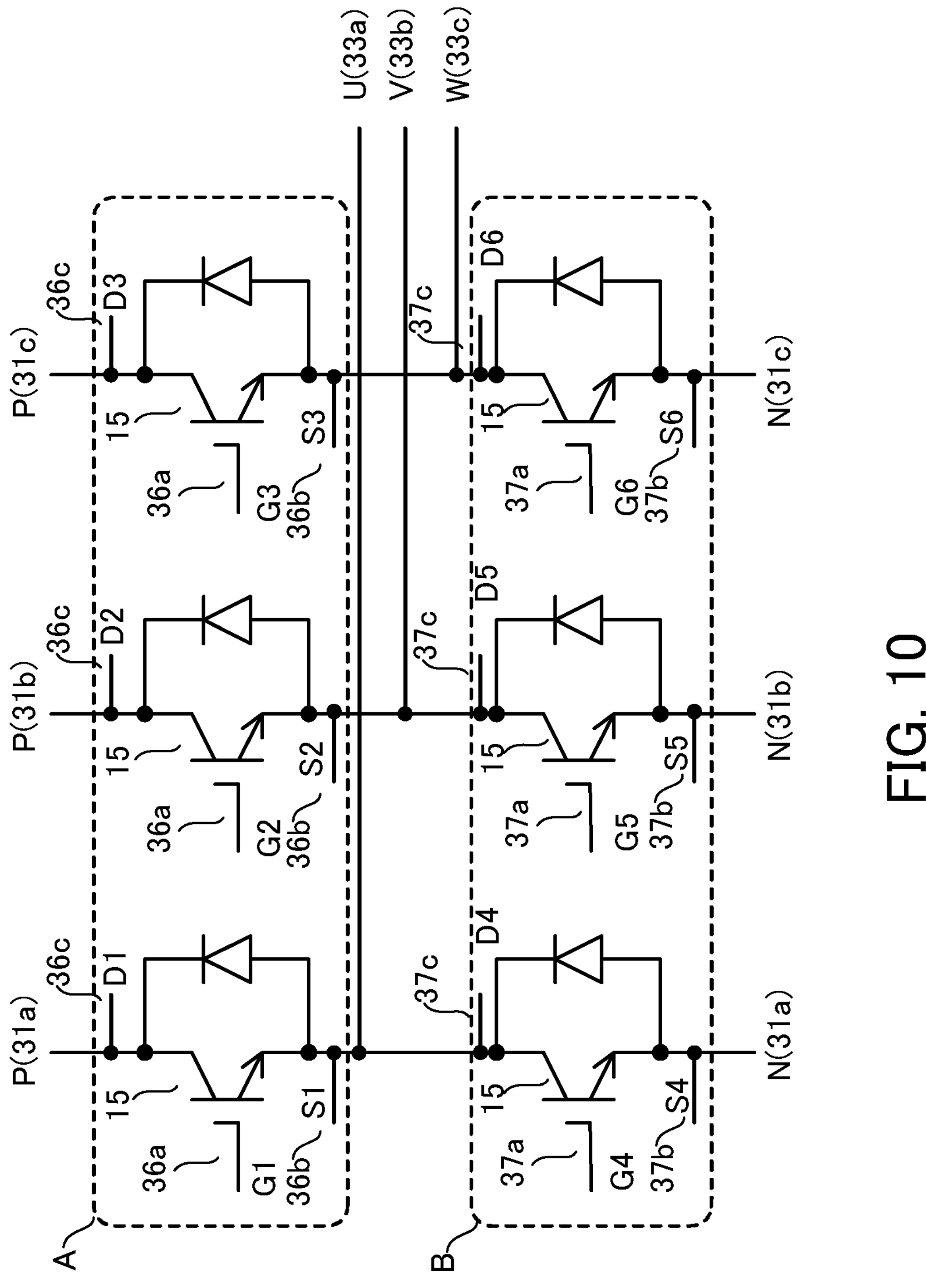
FIG. 10 is an equivalent circuit diagram depicting functions included in the semiconductor device according to the first embodiment.

Next, an equivalent circuit diagram depicting the functions of the semiconductor device 1 will be described with reference to FIG. 10. FIG. 10 is an equivalent circuit diagram depicting functions included in the semiconductor device according to the first embodiment. The semiconductor device 1 includes the equivalent circuit depicted in FIG. 10.

As depicted in FIG. 10, the semiconductor device 1 includes an upper arm portion A and a lower arm portion B. The upper arm portion A is composed of the semiconductor units 10*a* to 10*c* disposed on the top plate 21*a* of the cooling unit 20. The lower arm portion B is composed of the semiconductor units 10*d* to 10*f* disposed on the bottom plate 21*b* of the cooling unit 20.

In the semiconductor device 1, the positive terminals 31*a* to 31*c*, which are P terminals to which a positive electrode of an external power supply is connected, are electrically connected to the input electrodes (drain electrodes) of the semiconductor chips 15 in the upper arm portion A. The detection terminals 36*c* (that is, the "D1 to D3 terminals") are connected between the positive terminals 31*a* to 31*c* and the input electrodes of the semiconductor chips 15.

The output terminals 33*a* to 33*c*, which are U, V and W terminals to which loads are connected, are connected to the output electrodes 15*b* (source electrodes, see FIG. 8) of the semiconductor chips 15 in the upper arm portion A. The detection terminals 36*b* (or "S1 to S3 terminals") are connected between the respective output electrodes 15*b* (source electrodes, see FIG. 8) of the semiconductor chips 15 and the output terminals 33*a* to 33*c*.

In addition, the output terminals 33*a* to 33*c* are electrically connected to the respective input electrodes (drain electrodes) of the semiconductor chips 15 in the lower arm portion B. The detection terminals 37*c* (or "D4 to D6 terminals") are connected between the output terminals 33*a* to 33*c* and the respective input electrodes (or "drain electrodes") of the semiconductor chips 15.

The negative terminals 32*a* to 32*c*, which are N terminals to which a negative electrode of the external power supply is connected, are electrically connected to the respective output electrodes 15*b* (source electrodes, see FIG. 8) of the semiconductor chips 15 in the lower arm portion B. The detection terminals 37*c* (or "S4 to S6 terminals") are connected between the negative terminals 32*a* to 32*c* and the respective output electrodes 15*b* (source electrodes, see FIG. 8) of the semiconductor chips 15.

In addition, the control terminals 36*a*, which are G1 to G3 terminals to which a control power supply is connected from outside, are electrically connected to the control electrodes 15*a* (gate electrodes) of the semiconductor chips 15 in the upper arm portion A (see FIG. 8). The control terminals 37*a*, which are G4 to G6 terminals to which the control power supply is connected from outside, are electrically connected to the respective control electrodes 15*a* (gate electrodes, see FIG. 8) of the semiconductor chips 15 in the lower arm portion A.

Figure 11:
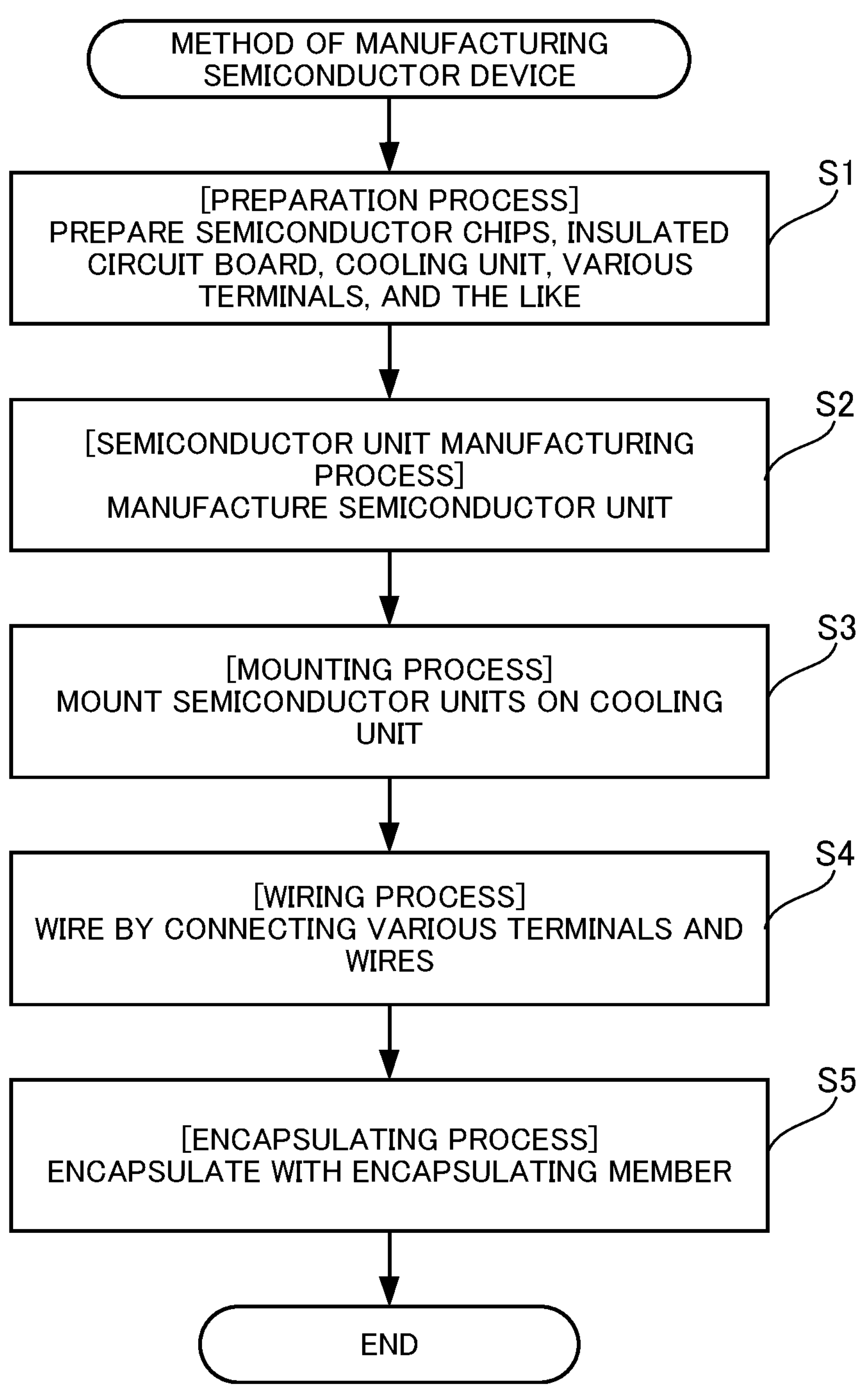
FIG. 11 is a flowchart depicting a method of manufacturing the semiconductor device according to the first embodiment.

Next, a method of manufacturing the semiconductor device 1 will be described with reference to FIG. 11. FIG. 11 is a flowchart depicting a method of manufacturing the semiconductor device according to the first embodiment. First, a preparation process is performed to prepare the components of the semiconductor device 1 (step S1). As examples, the components of the semiconductor device 1 prepared here include the semiconductor chips 15, the insulated circuit boards 11, the cooling unit 20, the positive terminals 31*a* to 31*c*, the negative terminals 32*a* to 32*c*, the output terminals 33*a* to 33*c*, the main current wiring 34, the control terminals 36*a* and 37*a*, the detection terminals 36*b*, 36*c*, 37*b*, and 37*c*, and the insulating jigs 50*a* and 50*b*. In addition to the above, parts used when manufacturing the semiconductor device 1 are prepared. At this time, both components and manufacturing equipment used in the manufacturing process are prepared.

Next, a semiconductor unit manufacturing process for manufacturing the semiconductor units 10 is performed (step S2). Each semiconductor unit 10 is manufactured by bonding the semiconductor chips 15 via the bonding member 39 onto the wiring board 13*a* of an insulated circuit board 11.

Next, a mounting process that mounts the semiconductor units 10 on the cooling unit 20 is performed (step S3). The semiconductor units 10*a* to 10*c* are mounted via the bonding member 39 in a row along the length direction (X direction) on the top plate 21*a* of the cooling unit 20. When doing so, the semiconductor units 10*a* to 10*c* are mounted so that the wiring boards 13*a* and 13*b* on each insulated circuit board 11 face the side walls 21*c*1 and 21*c*3, respectively, of the cooling unit 20. The semiconductor units 10*d* to 10*f* are mounted via the bonding member 39 in a row along the length direction (X direction) on the bottom plate 21*b* of the cooling unit 20. When doing so, the semiconductor units 10*d* to 10*f* are mounted so that the wiring boards 13*a* and 13*b* on each insulated circuit board 11 face the side walls 21*c*3 and 21*c*1, respectively, of the cooling unit 20.

Next, a wiring process is performed in which various terminals are attached to the semiconductor units 10 and wiring is performed by connecting wires (step S4). Here, the control wires 16*a* and the detection wires 16*b* and 16*c* are provided for the semiconductor units 10 mounted on the cooling unit 20 in step S3 (see FIG. 8).

As one example, the insulating jigs 50*a* are attached at predetermined locations on the side wall 21*c*1 of the cooling unit 20. When doing so, the insulating jigs 50*a* are fitted onto the side wall 21*c*1 of the cooling unit 20. The positive terminal 31*a* and the negative terminal 32*a* are attached to one insulating jig 50*a*. When doing so, the second end portion of the positive terminal 31*a* is bonded to the wiring board 13*a* of an insulated circuit board 11 on the top plate 21*a*. The second end portion of the negative terminal 32*a* is bonded to the wiring board 13*b* of an insulated circuit board 11 on the bottom plate 21*b*. The first end portion of the positive terminal 31*a* and the first end portion of the negative terminal 32*a* are provided on the outer surface 50*a*3 of this insulating jig 50*a* with a gap in between. Note that the other positive terminals 31*b* and 31*c* and the negative terminals 32*b* and 32*c* are attached in the same manner.

In addition, the insulating jigs 50*b* are attached to predetermined locations on the side wall 21*c*3 of the cooling unit 20. When doing so, the insulating jigs 50*b* are fitted onto the side wall 21*c*3 of the cooling unit 20. The output terminal 33*a* is attached to one insulating jig 50*b*. When doing so, a second end portion of the output terminal 33*a* is bonded to the wiring board 13*b* of an insulated circuit board 11 on the top plate 21*a*. A first end portion of the output terminal 33*a* is bonded to the wiring board 13*a* of an insulated circuit board 11 on the bottom plate 21*b*. Note that the other output terminals 33*b* and 33*c* are also attached in the same manner.

The output electrodes 15*b* of the semiconductor chips 15 and the wiring boards 13*b* of the semiconductor units 10 on the top plate 21*a* and the bottom plate 21*b* are electrically connected by the main current wiring 34, which is composed of wires. The control terminals 36*a* and the detection terminals 36*b* and 36*c* are bonded to the wiring boards 13*c*, 13*d* and 13*e* of the semiconductor units 10 on the top plate 21*a*. The control terminals 37*a* and the detection terminals 37*b* and 37*c* are bonded to the wiring boards 13*c*, 13*d*, and 13*e* of the semiconductor units 10 on the bottom plate 21*b*.

Next, an encapsulating process is performed to encapsulate the cooling unit 20 including the semiconductor units 10, which have been wired in step S4, with an encapsulating member (step S5). The cooling unit 20 including the semiconductor units 10 wired in step S4 is placed into a predetermined jig with an internal cavity. This cavity accommodates the semiconductor units 10*a* to 10*c* on the top plate 21*a* and the semiconductor units 10*d* to 10*f* on the bottom plate 21*b*. The inside of this jig is filled with the encapsulating member to encapsulate the structure. The encapsulating member then solidifies to become the encapsulating body 40. When the jig is removed, manufacturing of the semiconductor device 1 depicted in FIGS. 1-4 is complete.

The semiconductor device 1 described above includes the semiconductor units 10*a* to 10*f*, the cooling unit 20, and the output terminals 33*a* to 33*c*. Each of the semiconductor units 10*a* to 10*f* includes an insulation circuit board 11 that has the semiconductor chips 15 and the wiring boards 13*a* and 13*b* connected to the semiconductor chips 15 on the front surface (or "first main surface"). When viewed from above, the cooling unit 20 includes the side wall 21*c*3, and also includes the top plate 21*a* on which the insulated circuit boards 11 of the semiconductor units 10*a* to 10*c* are disposed and the bottom plate 21*b* that is provided on the opposite side to the top plate 21*a* and on which the insulated circuit boards 11 of the semiconductor units 10*d* to 10*f* are to disposed. The output terminals 33*a* to 33*c* are connected, on the side wall 21*c*3 of the cooling unit 20, to the wiring boards 13*b* included in the semiconductor units 10*a* to 10*c* and the wiring boards 13*a* included in the semiconductor units 10*d* to 10*f*. With this semiconductor device 1, since the semiconductor units 10*a* to 10*c* and 10*d* to 10*f* may be disposed on the top plate 21*a* and the bottom plate 21*b*, respectively, of the cooling unit 20, it is possible to miniaturize the semiconductor device 1. In the semiconductor device 1, the semiconductor units 10*a* to 10*c* are disposed on the top plate 21*a* of the cooling unit 20 with the wiring boards 13*b*, which are connected to the output electrodes 15*b* of the semiconductor chips 15, facing the side wall 21*c*3. The semiconductor units 10*d* to 10*f* are disposed on the bottom plate 21*b* of the cooling unit 20 with the wiring boards 13*a*, which are connected to the input electrodes of the semiconductor chips 15, facing the side wall 21*c*3. This means that by disposing the output terminals 33*a* to 33*c* on the side wall 21*c*3 side of the cooling unit 20, the wiring boards 13*b* included in the semiconductor units 10*a* to 10*c* and the wiring boards 13*a* included in the semiconductor units 10*d* to 10*f* may be connected easily.

Second Embodiment

Figure 12:
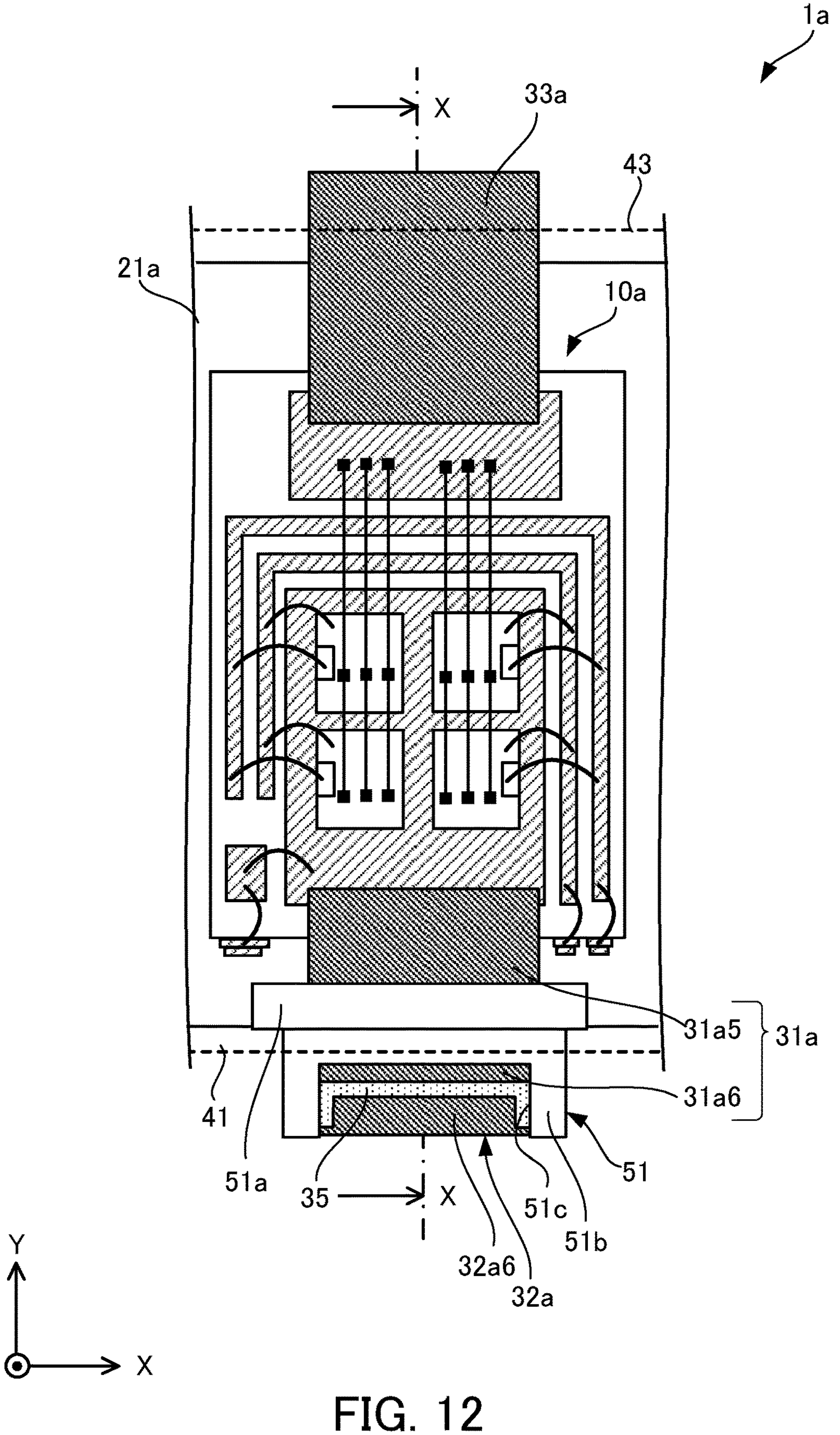
FIG. 12 is a plan view of a principal part of a front surface of a semiconductor device according to a second embodiment.
Figure 13:
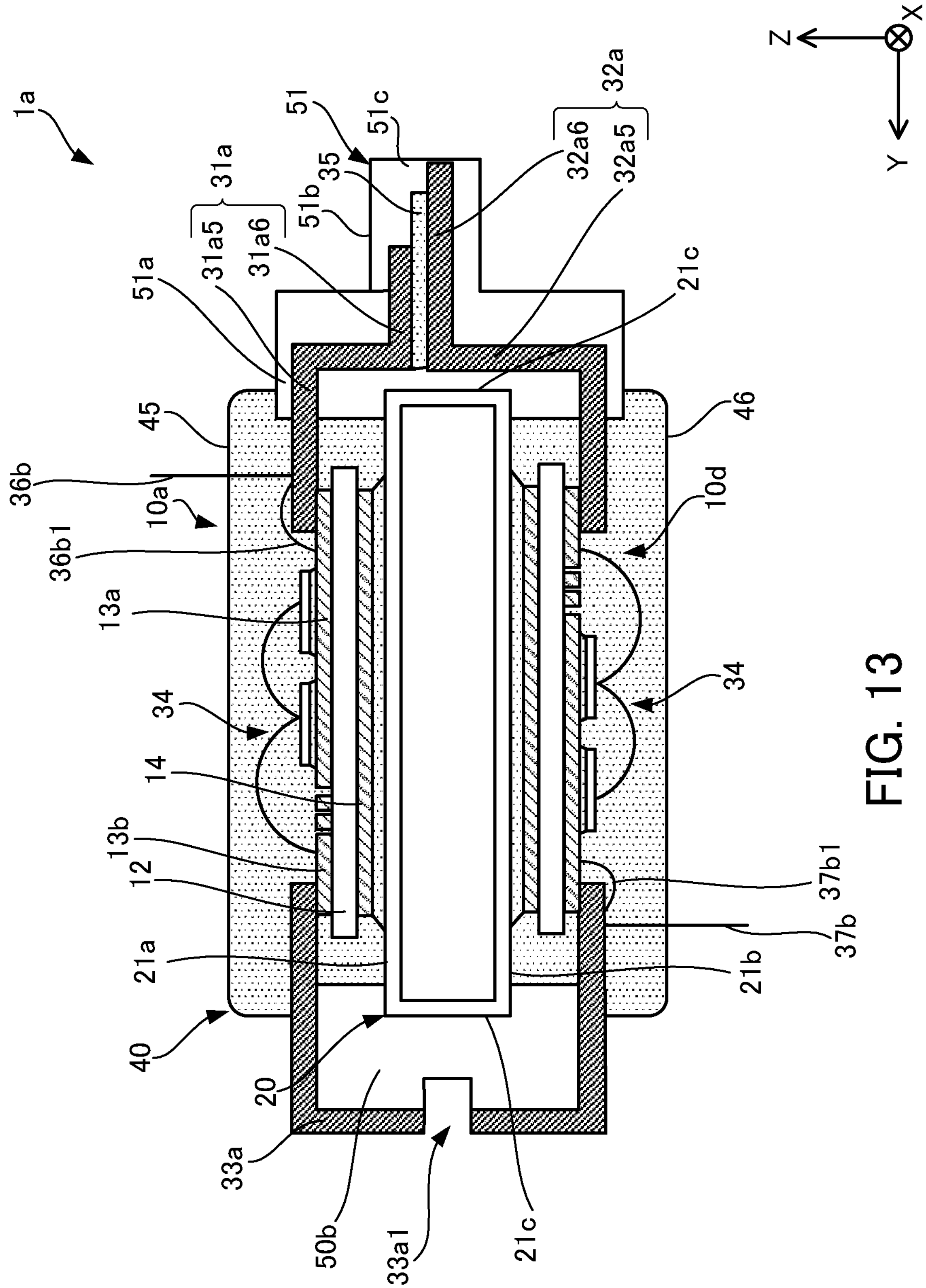
FIG. 13 is a cross-sectional view of the semiconductor device according to the second embodiment.

In a semiconductor device according to the second embodiment, positive terminals and negative terminals differ from those in the semiconductor device 1. The configuration in this case will now be described with reference to FIGS. 12 and 13. FIG. 12 is a plan view of a principal part of a front surface of the semiconductor device according to the second embodiment, and FIG. 13 is a cross-sectional view of the semiconductor device according to the second embodiment. Note that FIG. 12 is an enlarged plan view of a semiconductor unit 10*a* of the semiconductor device 1*a* and FIG. 13 is a cross-sectional view taken along the dot-dash line X-X in FIG. 12.

The semiconductor device 1*a* has the same configuration as the semiconductor device 1 according to the first embodiment except for the positive terminals 31*a* to 31*c*, the negative terminals 32*a* to 32*c*, and the insulating jigs 50*a*. Here, the positive terminal 31*a* and the negative terminal 32*a* of the semiconductor device 1*a* will be described. The positive terminals 31*b* and 31*c* and the negative terminals 32*b* and 32*c* are the same as the positive terminal 31*a* and the negative terminal 32*a*.

The positive terminal 31*a* and the negative terminal 32*a* are integrally molded with an insulating terminal jig 51 with insulating paper 35 disposed in between to form steps, and are exposed on the long side surface 41 side of the encapsulating body 40. That is, the positive terminal 31*a*, the insulating paper 35, and the negative terminal 32*a* are laminated on the long side surface 41 side. The positive terminal 31*a*, the insulating paper 35, and the negative terminal 32*a* that have been laminated are exposed from an opening 51*c* in the insulating terminal jig 51.

The positive terminal 31*a* is formed as a flat plate that is shaped like a crank when viewed from the side. The positive terminal 31*a* includes a wiring portion 31*a*5 and a contact portion 31*a*6. The wiring portion 31*a*5 is formed in an L shape when viewed from the side. A second end portion (on the inside of the semiconductor device 1) of the wiring portion 31*a*5 is bonded to the wiring board 13*a* of an insulated circuit board 11 disposed on the top plate 21*a* of the cooling unit 20. The contact portion 31*a*6 is integrally connected to a first end portion of the wiring portion 31*a*5. A front end portion of the contact portion 31*a*6 extends outward from the long side surface 41 side of the encapsulating body 40.

The negative terminal 32*a* is formed as a flat plate that is shaped like a crank when viewed from the side. The negative terminal 32*a* includes a wiring portion 32*a*5 and a contact portion 32*a*6. The wiring portion 32*a*5 is formed in an L shape when viewed from the side. A second end portion (on the inside of the semiconductor device 1) of the wiring portion 32*a*5 is bonded to the wiring board 13*b* of an insulated circuit board 11 disposed on the bottom plate 21*b* of the cooling unit 20. The contact portion 32*a*6 is integrally connected to a first end portion of the wiring portion 32*a*5. A front end portion of the contact portion 32*a*6 extends outward from the long side surface 41 side of the encapsulating body 40. The length of the contact portion 32*a*6 in the extending direction (+Y direction) may be longer than the length of the contact portion 31*a*6.

The insulating paper 35 is longer in this extending direction than the contact portion 31*a*6 but shorter than the contact portion 32*a*6. Accordingly, the insulating paper 35 is sandwiched between the overlapping parts of the contact portion 31*a*6 and the contact portion 32*a*6 and the front end portion of the insulating paper 35 is positioned between the front end portion of the contact portion 31*a*6 included in the positive terminal 31*a* and the front end portion of the contact portion 32*a*6 included in the negative terminal 32*a*. For this reason, the contact portion 31*a*6, the insulating paper 35, and the contact portion 32*a*6 form steps. That is, when looking from above, the front end portion of the contact portion 31*a*6 is exposed, the front end portion of the insulating paper 35 is exposed, and the front end portion of the contact portion 32*a*6 is also exposed. The insulating paper 35 is made of an insulating material that is electrically insulating. As examples of this insulating material, insulating paper made of a wholly aromatic polyamide polymer or a sheet-like material made of a fluorine-based or polyimide-based resin material is used.

The insulating terminal jig 51 integrally includes the positive terminal 31*a*, the insulating paper 35, and the negative terminal 32*a*. The insulating terminal jig 51 includes a fixing portion 51*a* and a protruding portion 51*b* that protrudes outward from the fixing portion 51*a*. The fixing portion 51*a* includes and fixes the positive terminal 31*a* and the negative terminal 32*a* that sandwich the insulating paper 35. The protruding portion 51*b* fixes the contact portion 31*a*6 of the positive terminal 31*a* and a (±X direction) side portion and a (−Y direction) front end portion of the contact portion 32*a*6 of the negative terminal 32*a*, which sandwich the insulating paper 35. The contact portion 31*a*6, the insulating paper 35, and the contact portion 32*a*6 that have been laminated are exposed from an opening 51*c* of the protruding portion 51*b*. This insulating terminal jig 51 is molded using thermoplastic resin. Example thermoplastic resins include polyphenylene sulfide (PPS), polybutylene terephthalate (PBT) resin, polybutylene succinate (PBS) resin, polyamide (PA) resin, and acrylonitrile butadiene styrene (ABS) resin.

Figure 14:
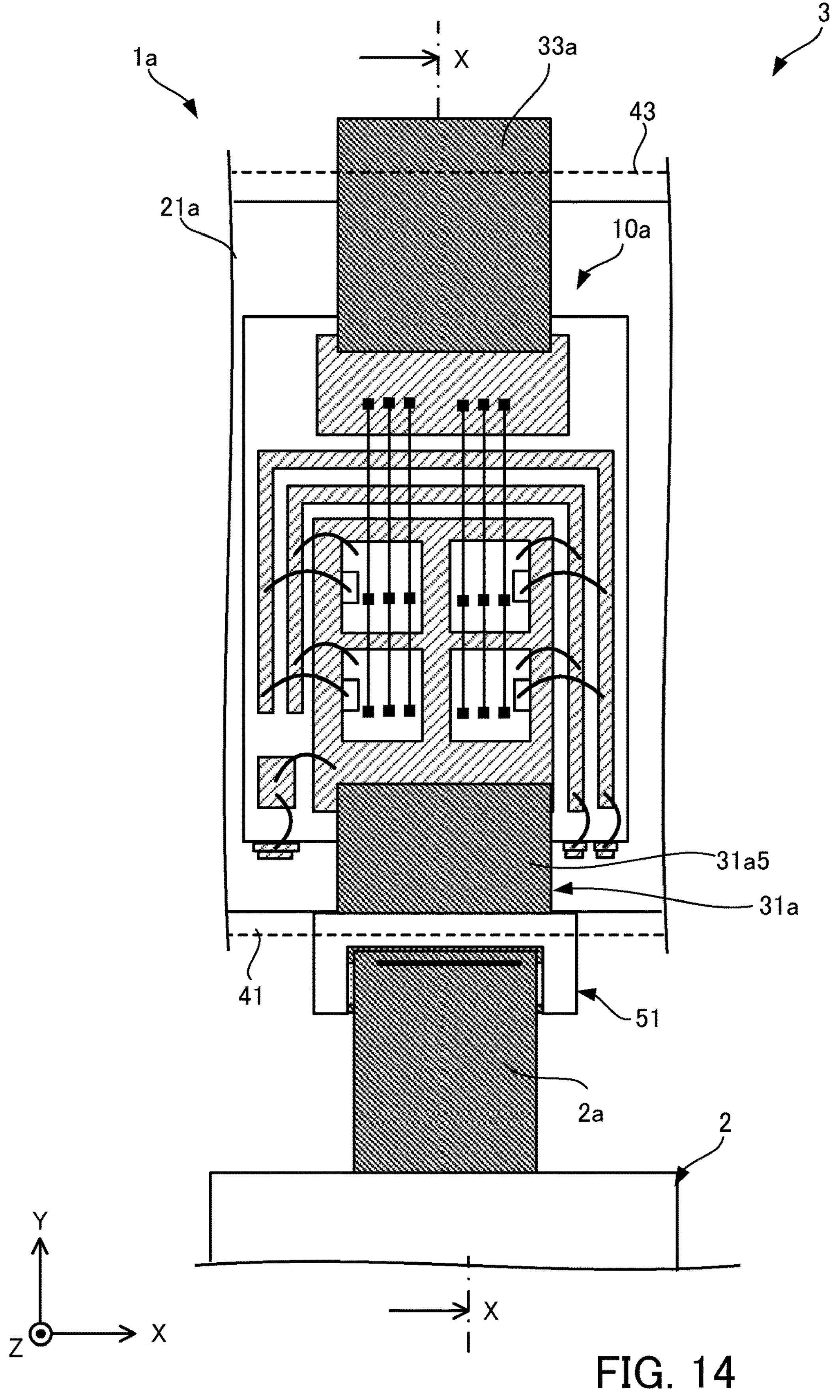
FIG. 14 is a plan view of a principal part of a front surface of a power converter system according to the second embodiment.
Figure 15:
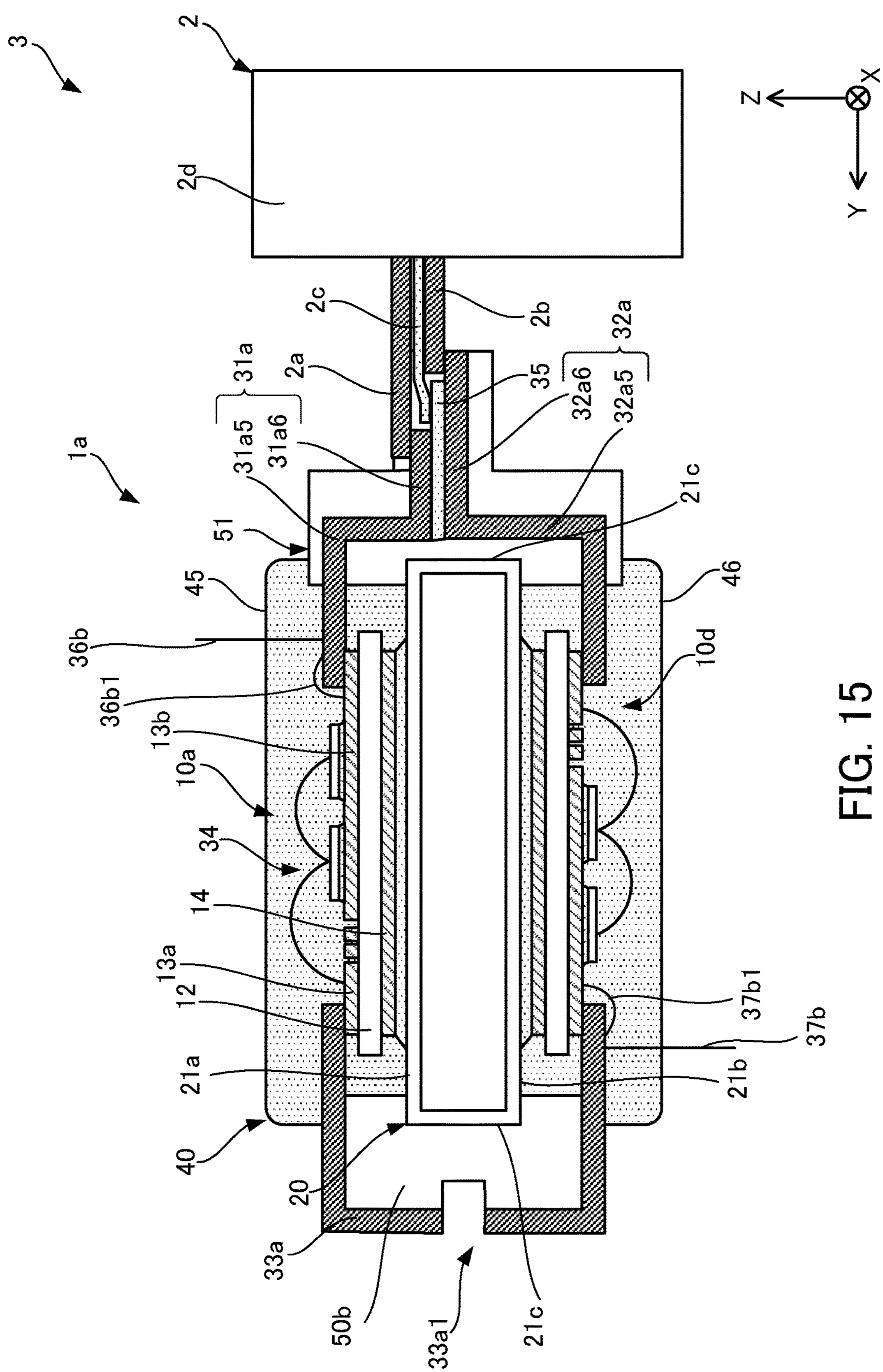
FIG. 15 is a cross-sectional view of the power converter system according to the second embodiment.

Next, a power converter system including the semiconductor device 1*a* will be described with reference to FIG. 14 and FIG. 15. FIG. 14 is a plan view of a principal part of a front surface of a power converter system according to the second embodiment, and FIG. 15 is a cross-sectional view of the power converter system according to the second embodiment. FIG. 14 is an enlarged plan view of the semiconductor unit 10*a*. FIG. 15 is a cross-sectional view taken along the dot-dash line X-X in FIG. 14. Note that the following description refers to the positive terminal 31*a* and the negative terminal 32*a*. The positive terminals 31*b* and 31*c* and the negative terminals 32*b* and 32*c* are the same as the positive terminal 31*a* and the negative terminal 32*a*.

A power converter system 3 includes the semiconductor device 1*a* and a capacitor 2. Here, the semiconductor device 1*a* and the capacitor 2 are disposed as close as possible to each other with their respective side portions facing each other. Connection wiring (indicated here as connection wiring 2*a*) electrically and mechanically connects the semiconductor device 1*a* and the capacitor 2. When doing so, the connection wiring 2*a* has linear laser welding traces on the capacitor 2 side and the semiconductor device 1*a* side. Note that the number and width of the connection wiring 2*a* are mere examples. The width of the connection wiring 2*a* is selected according to the width of the contact portion 31*a*6 of the positive terminal 31*a* and the contact portion 32*a*6 of the negative terminal 32*a* that are exposed from the opening 51*c* in the insulating terminal jig 51 included in the semiconductor device 1*a*.

The capacitor 2 includes a case 2*d*, connection wiring 2*a* and 2*b*, and insulating paper 2*c*. The case 2*d* is a capacitor main body. The connection wiring 2*a* and 2*b* and the insulating paper 2*c* are disposed on a side portion of the case 2*d*. A plurality of capacitors, which each have an N electrode and a P electrode, are housed inside the case 2*d*. The material of the case 2*d* is epoxy resin, for example. The connection wiring 2*a* has a second end portion that is electrically connected to the N electrode of every capacitor element inside the case 2*d*. A first end portion of the connection wiring 2*a* extends outside the case 2*d*. The connection wiring 2*b* has a second end portion electrically connected to the P electrode of every capacitor element inside the case 2*d*. A first end portion of the connection wiring 2*b* extends outside the case 2*d*. The connection wiring 2*a* and 2*b* are made of a metal with superior electrical conductivity. Example metals are copper and copper alloy.

The insulating paper 2*c* is longer than the connection wiring 2*b* and extends outside the case 2*d* between the connection wiring 2*a* and the connection wiring 2*b*. Accordingly, on the outside of the case 2*d*, the connection wiring 2*a* and 2*b* are kept insulated from each other by the insulating paper 2*c*. The insulating paper 2*c* is made of an insulating material that is flexible and electrically insulating. As examples of this insulating material, an insulating paper made of a wholly aromatic polyamide polymer or a sheet-like material made of a fluorine-based or polyimide-based resin material is used.

The connection wiring 2*a* and 2*b* of the capacitor 2 is bonded by laser welding to the contact portion 31*a*6 of the positive terminal 31*a* and the contact portion 32*a*6 of the negative terminal 32*a* of the semiconductor device 1*a*. When doing so, the insulating paper 2*c* contacts the insulating paper 35 of the semiconductor device 1*a*. This means that the positive terminal 31*a* and the connection wiring 2*a* are kept insulated from the negative terminal 32*a* and the connection wiring 2*b*. Through the above processes, the power converter system 3 including the semiconductor device 1*a* and the capacitor 2 is configured.

In this way, with the semiconductor device 1*a* also, since it is possible to dispose the semiconductor units 10*a* to 10*c* and 10*d* to 10*f* on the top plate 21*a* and the bottom plate 21*b* of the cooling unit 20, it is possible to miniaturize the semiconductor device 1*a* and in turn the power converter system 3 that includes the semiconductor device 1*a*. Also, with the semiconductor device 1*a*, it is possible to easily electrically connect the capacitor 2 without changing the configuration of the capacitor 2 to match the shapes of the positive terminals 31*a* to 31*c* and the negative terminals 32*a* to 32*c*.

Third Embodiment

Figure 16:
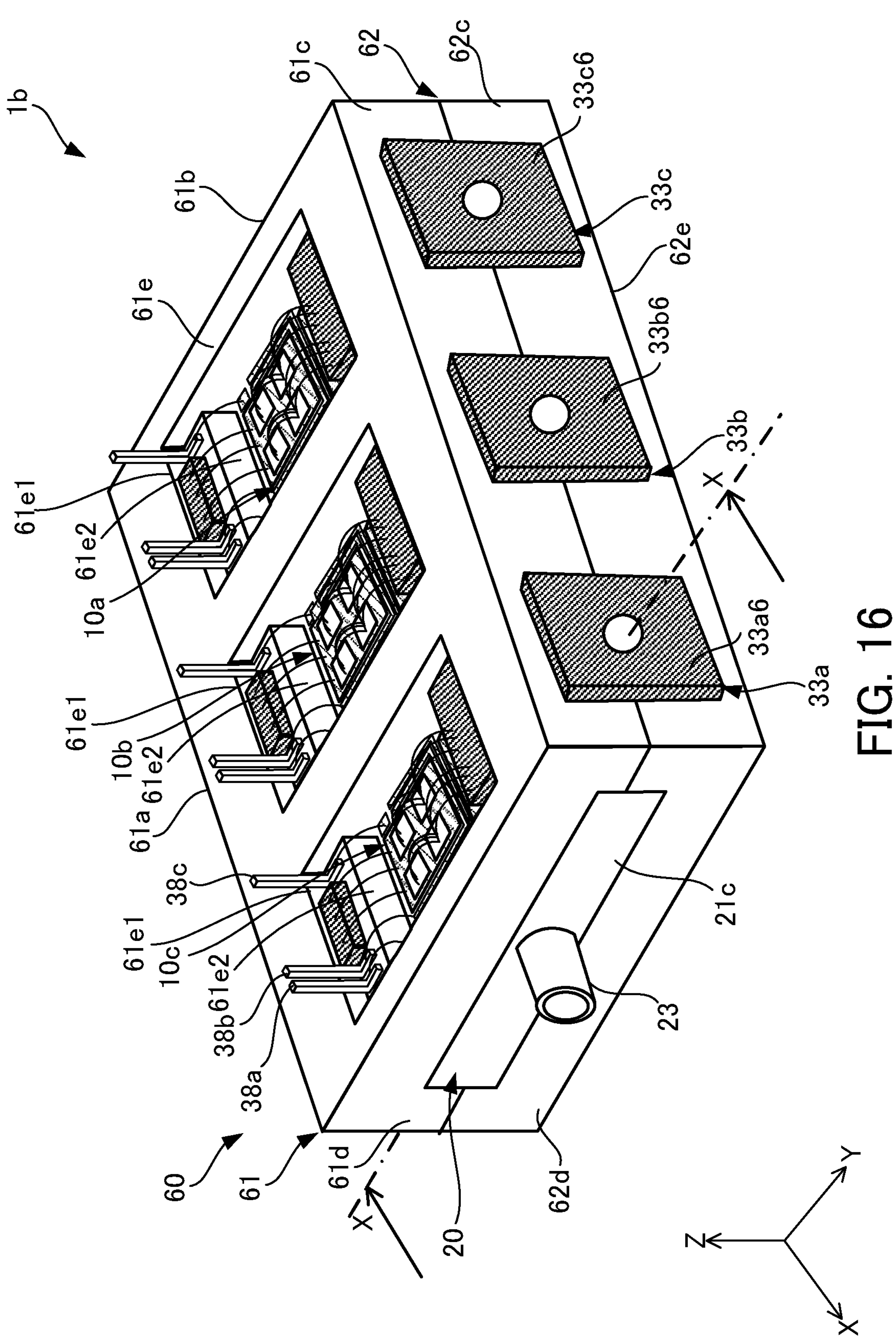
FIG. 16 is a perspective view of a semiconductor device according to a third embodiment.
Figure 17:
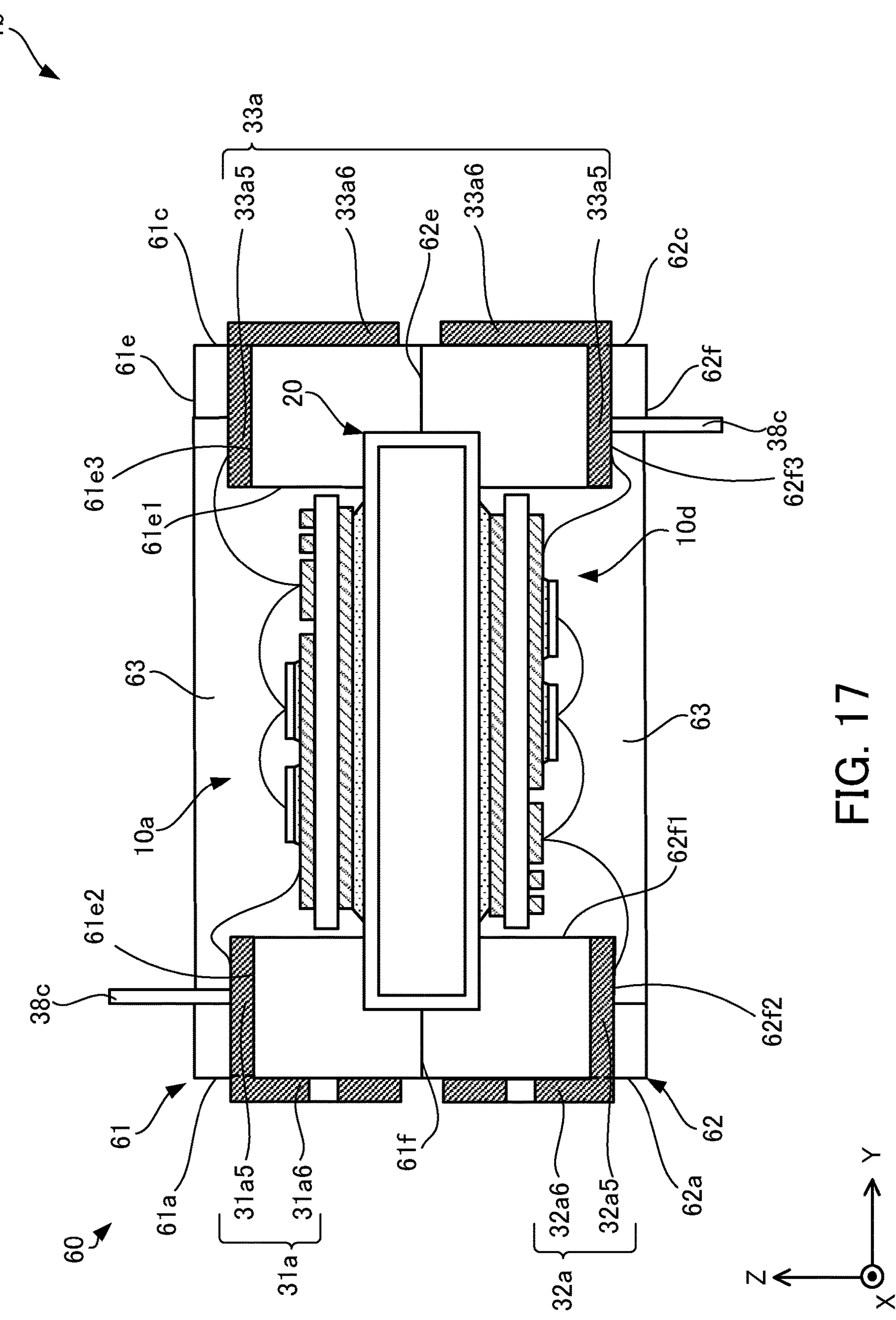
FIG. 17 is a cross-sectional view of the semiconductor device according to the third embodiment.
Figure 18:
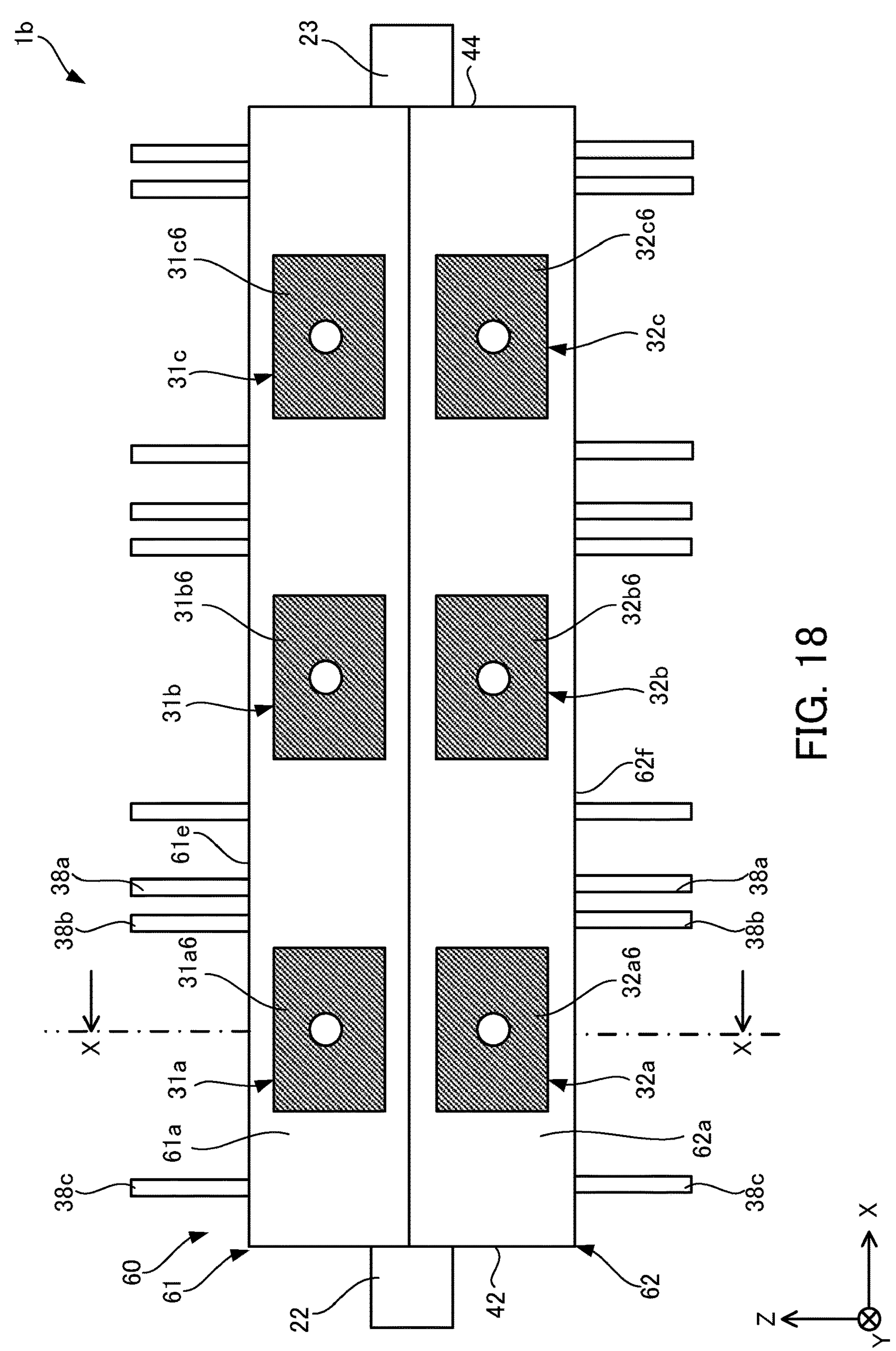
FIG. 18 is a side view (of the positive and negative terminal side) of the semiconductor device according to the third embodiment.
Figure 19:
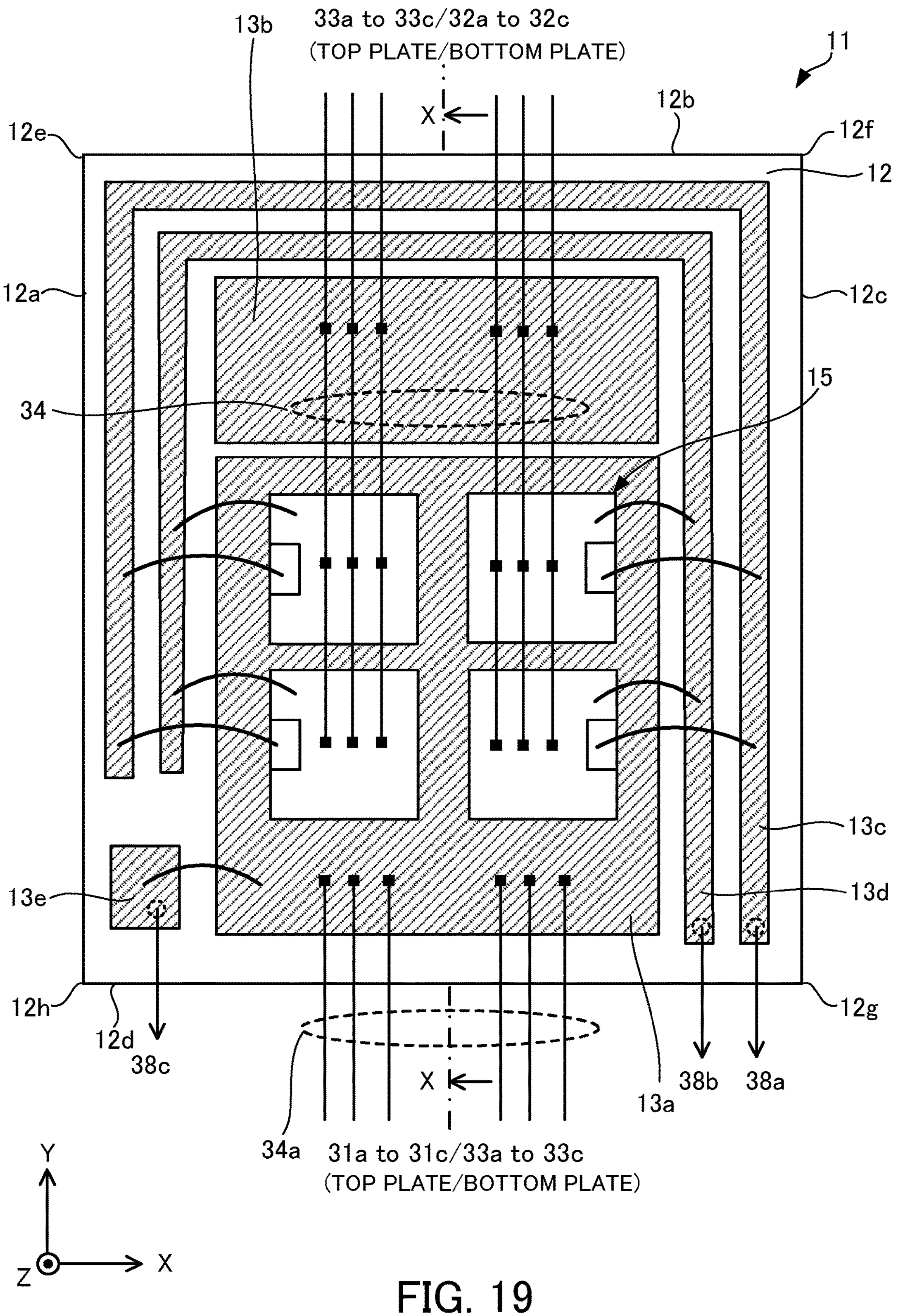
FIG. 19 is a plan view of an insulated circuit board included in the semiconductor device according to the third embodiment.

In this third embodiment, a configuration where the semiconductor unit 10 and the cooling unit 20 according to the first embodiment are housed in a case will be described with reference to FIG. 16 to FIG. 19. FIG. 16 is a perspective view of a semiconductor device according to the third embodiment. FIG. 17 is a cross-sectional view of the semiconductor device according to the third embodiment. FIG. 18 is a side view (depicting the positive and negative terminals) of the semiconductor device according to the third embodiment. FIG. 19 is a plan view of an insulated circuit board included in the semiconductor device according to the third embodiment. Note that FIG. 17 is a cross-sectional view taken along the dot-dash line X-X in FIG. 16. Note that in the following description, components that are the same as the semiconductor device 1 have been assigned the same reference numerals and description thereof is simplified or omitted.

The semiconductor device 1*b* according to the third embodiment includes the semiconductor unit 10, the cooling unit 20, the positive terminals 31*a* to 31*c*, the negative terminals 32*a* to 32*c*, the output terminals 33*a* to 33*c*, and the main current wiring 34. These components of the semiconductor device 1*b* are housed in a case 60. Note that the cooling unit 20, the positive terminals 31*a* to 31*c*, the negative terminals 32*a* to 32*c*, the output terminals 33*a* to 33*c*, and the main current wiring 34 are the same as those of the semiconductor device 1.

The case 60 includes an upper body portion 61 and a lower body portion 62. The upper body portion 61 includes a long side surface 61*a*, a short side surface 61*b*, a long side surface 61*c*, and a short side surface 61*d*, which surround the four sides in that order. The upper body portion 61 includes a front surface 61*e* at an upper part and a dividing surface 61*f* at a lower part.

The upper body portion 61 has storage regions 61*e*1, which are open along a short-axis direction (that is, the Y direction), formed in the front surface 61*e* so as to be aligned in a long-axis direction (that is, the X direction). A step 61*e*2 is formed on the long side surface 61*a* side of each storage region 61*e*1 in the upper body portion 61. A step 61*e*3 is also formed on the long side surface 61*c* side of each storage region 61*e*1 in the upper body portion 61. The steps 61*e*2 and 61*e*3 are parallel to the front surface 61*e* and positioned lower than the front surface 61*e*. Note that an encapsulating member that encapsulates the storage regions 61*e*1 has been omitted from FIG. 16. Note that the encapsulating member used in the semiconductor device 1*b* may be the same as the encapsulating body 40. That is, the encapsulating member includes a thermosetting resin and a filler contained within the thermosetting resin. Example thermosetting resins include epoxy resin, phenolic resin, and maleimide resin. The filler is silicon oxide, aluminum oxide, boron nitride, or aluminum nitride.

The positive terminals 31*a* to 31*c* are provided along the X direction on the long side surface 61*a* of the upper body portion 61. The positive terminals 31*a* to 31*c* may be integrally molded with the upper body portion 61. The positive terminals 31*a* to 31*c* are L-shaped when viewed from the side, and include wiring portions and contact portions 31*a*6 to 31*c*6 (in FIG. 17, the positive terminal 31*a* including a wiring portion 31*a*5 and a contact portion 31*a*6 is depicted). Each wiring portion is formed as a flat plate when viewed from the side. First end portions of the wiring portions (on the inside of the semiconductor device 1*b*) are disposed on the steps 61*e*2 of the upper body portion 61. Second end portions of the wiring portions (on the outside of the semiconductor device 1*b*) are exposed from the long side surface 61*a* and are integrally joined to the contact portions 31*a*6 to 31*c*6. The contact portions 31*a*6 to 31*c*6 are formed as flat plates. The contact portions 31*a*6 to 31*c*6 are provided along the X direction on the long side surface 61*a* of the upper body portion 61.

The output terminals 33*a* to 33*c* may be configured to be vertically separable in the ±Z direction, for example. In this case, upper parts of the output terminals 33*a* to 33*c* are provided along the X direction on the long side surface 61*c* of the upper body portion 61. The upper parts of the output terminals 33*a* to 33*c* may be integrally molded with the upper body portion 61. The upper parts of the output terminals 33*a* to 33*c* are L-shaped when viewed from the side, and include wiring portions and contact portions 33*a*6 to 33*c*6 (the output terminal 33*a* including a wiring portion 33*a*5 and a contact portion 33*a*6 is depicted in FIG. 17). Each wiring portion (the wiring portion 33*a*5 is depicted in FIG. 17) is formed as a flat plate when viewed from the side. First end portions of the wiring portions (on the inside of the semiconductor device 1*b*) are disposed on the steps 61*e*3 of the upper body portion 61. Second end portions of the wiring portions (on the outside of the semiconductor device 1*b*) are exposed from the long side surface 61*c* and are integrally joined to the contact portions 33*a*6 to 33*c*6. The contact portions 33*a*6 to 33*c*6 are formed as flat plates. The contact portions 33*a*6 to 33*c*6 are provided along the X direction on the long side surface 61*c* of the upper body portion 61.

The control terminals 38*a* and the detection terminals 38*b* and 38*c* are configured with the same functions and materials as the control terminals 36*a* and 37*a* and the detection terminals 36*b*, 36*c*, 37*b* and 37*c*. As one example, the control terminals 38*a* and the detection terminals 38*b* and 38*c* are formed in L shapes when viewed in the X direction. The control terminals 38*a* and the detection terminals 38*b* and 38*c* are disposed on the step 61*e*2 of each storage region 61*e*1 in the upper body portion 61. The control terminal 38*a* and the detection terminal 38*b* are disposed in that order from the short side surface 61*d* side. The detection terminals 38*c* are disposed so that the positive terminals 31*a* to 31*c* are interposed between the detection terminals 38*b* and the detection terminals 38*c*. The control terminals 38*a* and the detection terminals 38*b* and 38*c* may also be integrally molded with the upper body portion 61.

The upper body portion 61 is attached to the top plate 21*a* side of the cooling unit 20 that has the semiconductor units 10*a* to 10*c* mounted on the top plate 21*a*. The semiconductor units 10*a* to 10*c* are exposed from the storage regions 61*e*1 with the wiring board 13*a* of the insulated circuit board 11 facing the step 61*e*2 and the wiring board 13*b* facing the step 61*e*3.

The lower body portion 62 also includes a long side surface 62*a*, a short side surface 62*b*, a long side surface 62*c*, and a short side surface 62*d* that surround the four sides in that order. The lower body portion 62 also includes a dividing surface 62*e* at an upper part and a rear surface 62*f* at a lower part.

The lower body portion 62 has storage regions 62*f*1, which are open along a short-axis direction (that is, the Y direction), formed in the rear surface 62*f* so as to be aligned in a long-axis direction (that is, the X direction). A step 62*f*2 is also formed on the long side surface 62*a* side of each storage region 62*f*1 in the lower body portion 62. A step 62*f*3 is also formed on the long side surface 61*c* side of each storage region 61*f*1 in the lower body portion 62. The steps 62*f*2 and 62*f*3 are parallel to the rear surface 62*f* and positioned lower than the rear surface 62*f*. Note that an encapsulating member that encapsulates the storage regions 62*f*1 has been omitted from FIG. 16.

The negative terminals 32*a* to 32*c* are provided along the X direction on the long side surface 62*a* of the lower body portion 62. The negative terminals 32*a* to 32*c* may be integrally molded with the lower body portion 62. The negative terminals 32*a* to 32*c* are L-shaped when viewed from the side, and include wiring portions and contact portions 32*a*6 to 32*c*6 (in FIG. 17, the negative terminal 32*a* including a wiring portion 32*a*5 and a contact portion 32*a*6 is depicted). Each wiring portion is formed as a flat plate when viewed from the side. First end portions of the wiring portions (on the inside of the semiconductor device 1*b*) are disposed on the steps 62*e*2 of the lower body portion 62. Second end portions of the wiring portions (on the outside of the semiconductor device 1*b*) are exposed from the long side surface 62*a* and are integrally joined to the contact portions 32*a*6 to 32*c*6. The contact portions 32*a*6 to 32*c*6 are formed as flat plates. The contact portions 32*a*6 to 32*c*6 are provided along the X direction on the long side surface 62*a* of the lower body portion 62.

In the same way as the upper body portion 61, the output terminals 33*a* to 33*c* may be configured to be vertically separable in the ±Z direction, for example. In this case, lower parts of the output terminals 33*a* to 33*c* are provided along the X direction on the long side surface 62*c* of the lower body portion 62. The lower parts of the output terminals 33*a* to 33*c* may be integrally molded with the lower body portion 62. The lower parts of the output terminals 33*a* to 33*c* are L-shaped when viewed from the side, and include wiring portions and contact portions 33*a*6 to 33*c*6 (the output terminal 33*a* including a wiring portion 33*a*5 and a contact portion 33*a*6 is depicted in FIG. 17). Each wiring portion (the wiring portion 33*a*5 is depicted in FIG. 17) is formed as a flat plate when viewed from the side. First end portions of the wiring portions (on the inside of the semiconductor device 1*b*) are disposed on the steps 62*f*3 of the lower body portion 62. Second end portions of the wiring portions (on the outside of the semiconductor device 1*b*) are exposed from the long side surface 62*c* and are integrally joined to the contact portions 33*a*6 to 33*c*6. The contact portions 33*a*6 to 33*c*6 are formed as flat plates. The contact portions 33*a*6 to 33*c*6 are provided along the X direction on the long side surface 62*c* of the lower body portion 62.

A control terminal 38*a* and detection terminals 38*b* and 38*c* are provided on the step 62*f*3 of each storage region 62*f*1 of the lower body portion 62. The control terminals 38*a* and the detection terminals 38*b* and 38*c* may also be integrally molded with the lower body portion 62. On each step 62*f*3, the control terminal 38*a* and the detection terminal 38*b* are disposed closest to and next closest to the short side surface 62*d*, respectively. The detection terminal 38*c* is disposed so that one of the output terminals 33*a* to 33*c* is interposed between the detection terminal 38*b* and the detection terminal 38*c*.

The lower body portion 62 is attached to the bottom plate 21*b* side of the cooling unit 20 that has the semiconductor units 10*d* to 10*f* mounted on the bottom plate 21*b*. The semiconductor units 10*d* to 10*f* are exposed from the storage regions 62*f*1 with the wiring board 13*a* of the insulated circuit board 11 facing the step 62*f*3 and the wiring board 13*b* facing the step 62*f*2.

When the upper body portion 61 and the lower body portion 62 are attached in this way, the contact portions 31*a*6 to 31*c*6 of the positive terminals 31*a* to 31*c* of the upper body portion 61 and the contact portions 32*a*6 to 32*c*6 of the negative terminals 32*a* to 32*c* of the lower body portion 62 become disposed in straight lines (in the ±Z direction). That is, the contact portions 31*a*6 to 31*c*6 of the positive terminals 31*a* to 31*c* of the upper body portion 61 and the contact portions 32*a*6 to 32*c*6 of the negative terminals 32*a* to 32*c* of the lower body portion 62 are respectively aligned in the ±Z direction (first direction). In the same way, the contact portions 33*a*6 to 33*c*6 of the upper output terminals 33*a* to 33*c* of the upper body portion 61 and the contact portions 33*a*6 to 33*c*6 of the lower output terminals 33*a* to 33*c* of the lower body portion 62 become disposed in straight lines (in the ±Z direction). Note that the ±Z direction is parallel to the direction in which the upper body portion 61 is mated on the lower body portion 62.

The semiconductor units 10 included in the semiconductor device 1*b* each include the semiconductor chips 15 and the insulated circuit board 11. The insulated circuit board 11 includes the insulating board 12, the wiring boards 13*a* to 13*e*, and the metal plate 14. The wiring boards 13*a* to 13*e* form the pattern depicted in FIG. 19, which differs to the semiconductor device 1.

In the same way as in the semiconductor device 1, the wiring board 13*a* (or "input wiring board") is formed so as to extend from the short side 12*d* of the insulating board 12 toward the short side 12*b*. The wiring board 13*b* (or "output wiring board") is formed adjacent to the wiring board 13*a* on the short side 12*b* side of the insulating board 12. The wiring board 13*b* is rectangular when viewed from above. The widths of the wiring boards 13*a* and 13*b* in the ±X direction are substantially equal. The wiring boards 13*a* and 13*b* are disposed in a straight line in the ±Y direction. A gap is provided between the wiring board 13*b* and the short side 12*b* of the insulating board 12. Gaps are provided between the ±X direction end portions of the wiring boards 13*a* and 13*b* and the long sides 12*a* and 12*c* of the insulating board 12.

The wiring board 13*c* (or "control wiring board") is U-shaped when viewed from above, and is formed outside the wiring boards 13*a*, 13*b*, and 13*d*. That is, the wiring board 13*c* extends from near the corner portion 12*g* along the long side 12*c* toward the short side 12*b* and turns toward the long side 12*a* at a position just before the short side 12*b*. The wiring board 13*c* then extends along the short side 12*b* toward the long side 12*a* and turns toward the short side 12*d* at a position just before the long side 12*a*. The wiring board 13*c* also extends along the long side 12*a* toward the short side 12*d* to a position just before the wiring board 13*e*.

When the insulated circuit board 11 is provided on the top plate 21*a* of the cooling unit 20, an end portion of a control terminal 38*a* is connected via a wire to a position near the corner portion 12*g* of the wiring board 13*c* (the circle drawn with a broken line in FIG. 19). An upper end portion of the control terminal 38*a* extends vertically upward. On the other hand, when the insulated circuit board 11 is provided on the bottom plate 21*b* of the cooling unit 20, an end portion of a control terminal 38*a* is connected via a wire to the vicinity of the corner portion 12*g* of the wiring board 13*c* (the circle drawn with a broken line in FIG. 19). An upper end portion of the control terminal 38*a* extends vertically downward.

The wiring board 13*d* (or "detection wiring board") is U-shaped when viewed from above, and is formed outside the wiring boards 13*a* and 13*b* but inside the wiring board 13*c*. That is, the wiring board 13*d* extends from near the corner portion 12*g* along the long side 12*c* toward the short side 12*b* and turns toward the long side 12*a* at a position just before the wiring board 13*c*. The wiring board 13*d* then extends along the short side 12*b* toward the long side 12*a* and turns toward the short side 12*d* at a position just before the long side 12*a*. The wiring board 13*d* also extends along the long side 12*a* toward the short side 12*d* to a position just before the wiring board 13*e*.

When the insulated circuit board 11 is provided on the top plate 21*a* of the cooling unit 20, an end portion of the detection terminal 38*b* is connected via a wire to a position near the corner portion 12*g* of the wiring board 13*d* (the circle drawn with a broken line in FIG. 19). An upper end portion of the detection terminal 38*b* extends vertically upward. On the other hand, when an insulated circuit board 11 is provided on the bottom plate 21*b* of the cooling unit 20, an end portion of the detection terminal 38*b* is connected via a wire to the vicinity of the corner portion 12*g* of the wiring board 13*d* (the circle drawn with a broken line in FIG. 19). An upper end portion of the detection terminal 38*b* extends vertically downward.

The wiring board 13*e* (or "detection wiring board") is rectangular when viewed from above. The wiring board 13*e* is formed near the corner portion 12*h* of the insulating board 12. The wiring board 13*e* is formed at a gap in the −Y direction from end portions of the wiring boards 13*c* and 13*d*.

When the insulated circuit board 11 is provided on the top plate 21*a* of the cooling unit 20, an end portion of the detection terminal 38*c* is connected via a wire to the wiring board 13*e* (the circle drawn with a broken line in FIG. 19). An upper end portion of the detection terminal 38*c* extends vertically upward. On the other hand, when the insulated circuit board 11 is provided on the bottom plate 21*b* of the cooling unit 20, an end portion of the detection terminal 38*c* is connected via a wire to the wiring board 13*e* (the circle drawn with a broken line in FIG. 19). An upper end portion of the detection terminal 38*c* extends vertically downward.

When the insulated circuit board 11 is provided on the top plate 21*a* of the cooling unit 20, the main current wiring 34 connects the wiring board 13*b* and the output electrodes 15*b* of the semiconductor chips 15, and further connects the output terminals 33*a* to 33*c*. The main current wiring 34*a* connects the wiring board 13*a* and the positive terminals 31*a* to 31*c*.

On the other hand, when the insulated circuit board 11 is provided on the bottom plate 21*b* of the cooling unit 20, the main current wiring 34 connects the wiring board 13*b* and the output electrodes 15*b* of the semiconductor chips 15, and further connects the negative terminals 32*a* to 32*c*. The main current wiring 34*a* connects the wiring board 13*a* and the output terminals 33*a* to 33*c*.

The semiconductor device 1*b* with the configuration described above is also manufactured according to the processes in steps S1 to S4 in FIG. 11. Note that the wiring between the control electrode 15*a* of the semiconductor chip 15 and the wiring board 13*c*, the wiring between the output electrode 15*b* of the semiconductor chip 15 and the wiring board 13*d*, and the wiring between the wiring boards 13*a* and 13*e* are connected for each semiconductor unit 10 in step S4. After step S4, the upper body portion 61 and the lower body portion 62 are attached to the cooling unit 20 so that the semiconductor units 10 are exposed from the storage regions 61*e*1 and 62*f*1. The main current wiring 34 and 34*a* is connected to the positive terminals 31*a* to 31*c*, the negative terminals 32*a* to 32*c*, and the output terminals 33*a* to 33*c* within the storage regions 61*e*1 and 62*f*1. After this, the insides of the storage regions 61*e*1 and 62*f*1 are encapsulated with an encapsulating member 63 (step S5).

Through the processes described above, the semiconductor device 1*b* is manufactured. Note that the insulated circuit board 11 depicted in FIG. 8 may be used in place of the insulated circuit board 11 depicted in FIG. 19.

Fourth Embodiment

Figure 20:
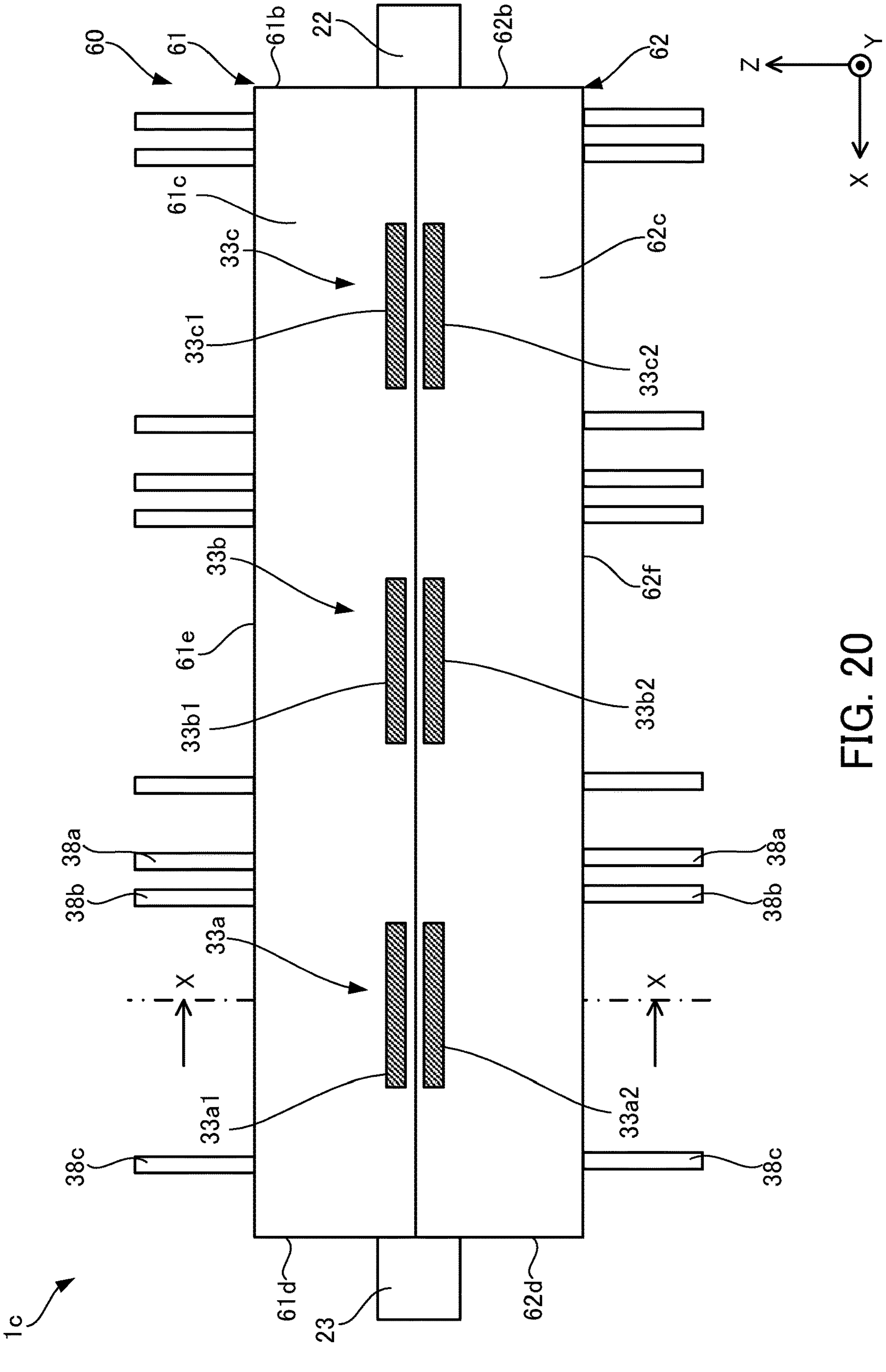
FIG. 20 is a side view (on an output terminal side) of a semiconductor device according to a fourth embodiment.
Figure 21:
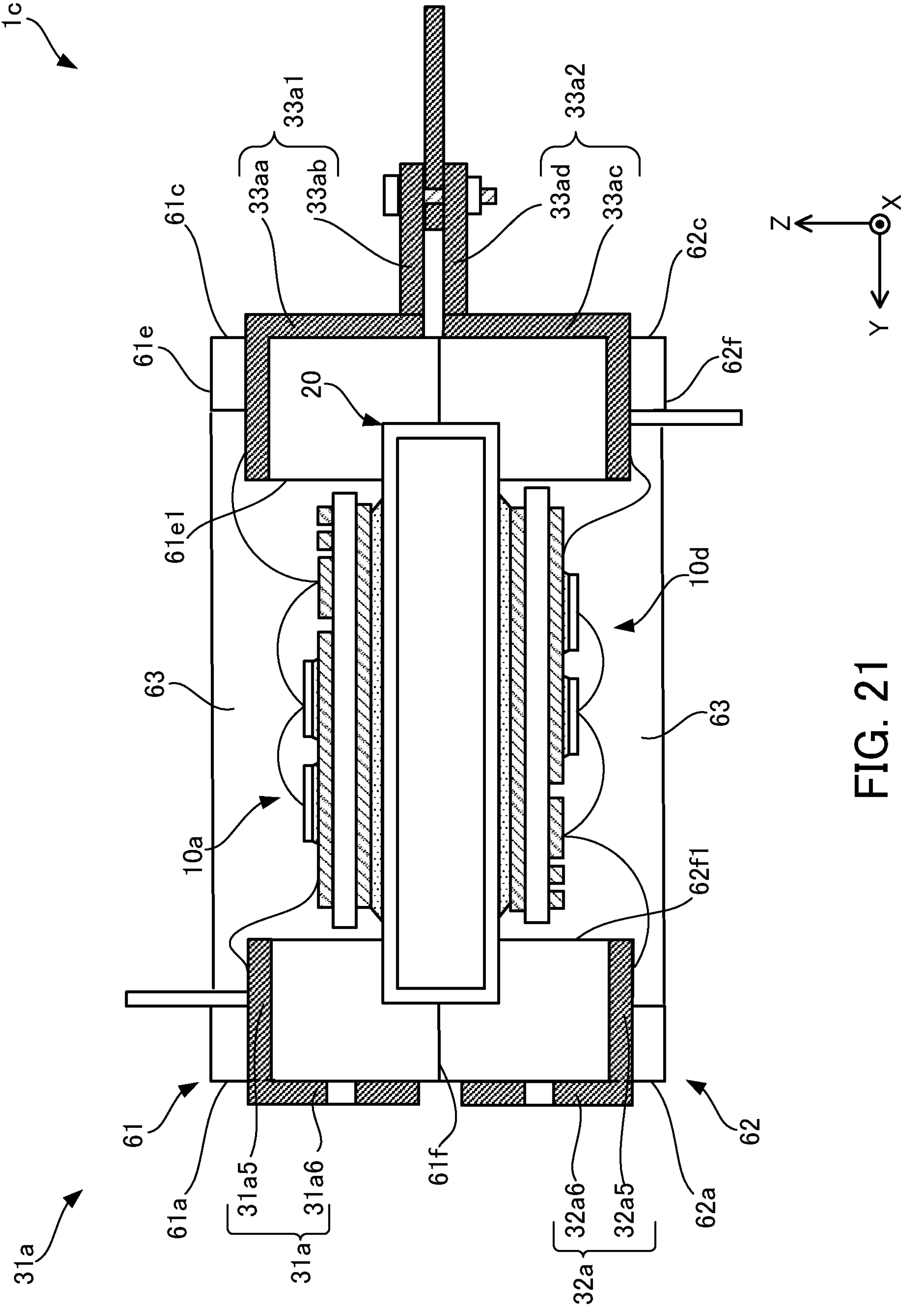
FIG. 21 is a cross-sectional view of the semiconductor device according to the fourth embodiment.

Modifications to the output terminals of the semiconductor device 1*b* according to the third embodiment will now be described as fourth and subsequent embodiments. First, a semiconductor device 1*c* according to the fourth embodiment will be described with reference to FIGS. 20 and 21. FIG. 20 is a side view (depicting the output terminals) of the semiconductor device according to the fourth embodiment, and FIG. 21 is a cross-sectional view of the semiconductor device according to the fourth embodiment. Note that FIG. 21 is a cross-sectional view taken along the dot-dash line X-X in FIG. 20. Also, in the fourth embodiment, only configurations that differ from the semiconductor device 1*b* will be described.

In the semiconductor device 1*c*, the output terminals 33*a* to 33*c* include upper terminal portions 33*a*1 to 33*c*1 and lower terminal portions 33*a*2 to 33*c*2. The upper terminal portion 33*a*1 and the lower terminal portion 33*a*2 depicted in FIG. 21 will be described here as an example. The upper terminal portions 33*b*1 and 33*c*1 and the lower terminal portions 33*b*2 and 33*c*2 also have the same configuration.

The upper terminal portion 33*a*1 and the lower terminal portion 33*a*2 include wiring portions 33*aa* and 33*ac* and contact portions 33*ab* and 33*ad*. The wiring portions 33*aa* and 33*ac* are L-shaped when viewed from the side. A first end portion of the wiring portion 33*aa* is connected via a wire to the wiring board 13*b* on the top plate 21*a* side of the cooling unit 20. A contact portion 33*ab* is joined to a second end portion of the wiring portion 33*aa*. A first end portion of the wiring portion 33*ac* is bonded via a wire to the wiring board 13*a* on the bottom plate 21*b* side of the cooling unit 20. A contact portion 33*ad* is connected to a second end portion of the wiring portion 33*ac*.

The contact portions 33*ab* and 33*ad* are formed as flat plates. The contact portions 33*ab* and 33*ad* are connected to the second end portions of the wiring portions 33*aa* and 33*ac* and extend outward from the long side surfaces 61*c* and 62*c* of the case 60. The contact portions 33*ab* and 33*ad* that extend from the long side surfaces 61*c* and 62*c* of the case 60 coincide when looking from above. A gap (in the Z direction) is formed between the contact portions 33*ab* and 33*ad* that extend from the long side surfaces 61*c* and 62*c* of the case 60. By interposing another terminal from outside in this gap and screwing the contact portions 33*ab* and 33*ad* together, the other terminal may be electrically and mechanically connected.

The output terminals 33*a* to 33*c* including the upper terminal portions 33*a*1 to 33*c*1 and the lower terminal portions 33*a*2 to 33*c*2 are integrally molded with the upper body portion 61 and the lower body portion 62, respectively, of the case 60. Note that in the same way as in the third embodiment, the positive terminals 31*a* to 31*c*, the negative terminals 32*a* to 32*c*, the control terminals 38*a*, and the detection terminals 38*b* and 38*c* may also be integrally molded with the upper body portion 61 and the lower body portion 62 of the case 60. Note that it is also possible to use the insulated circuit board 11 depicted in FIG. 8.

Fifth Embodiment

Figure 22:
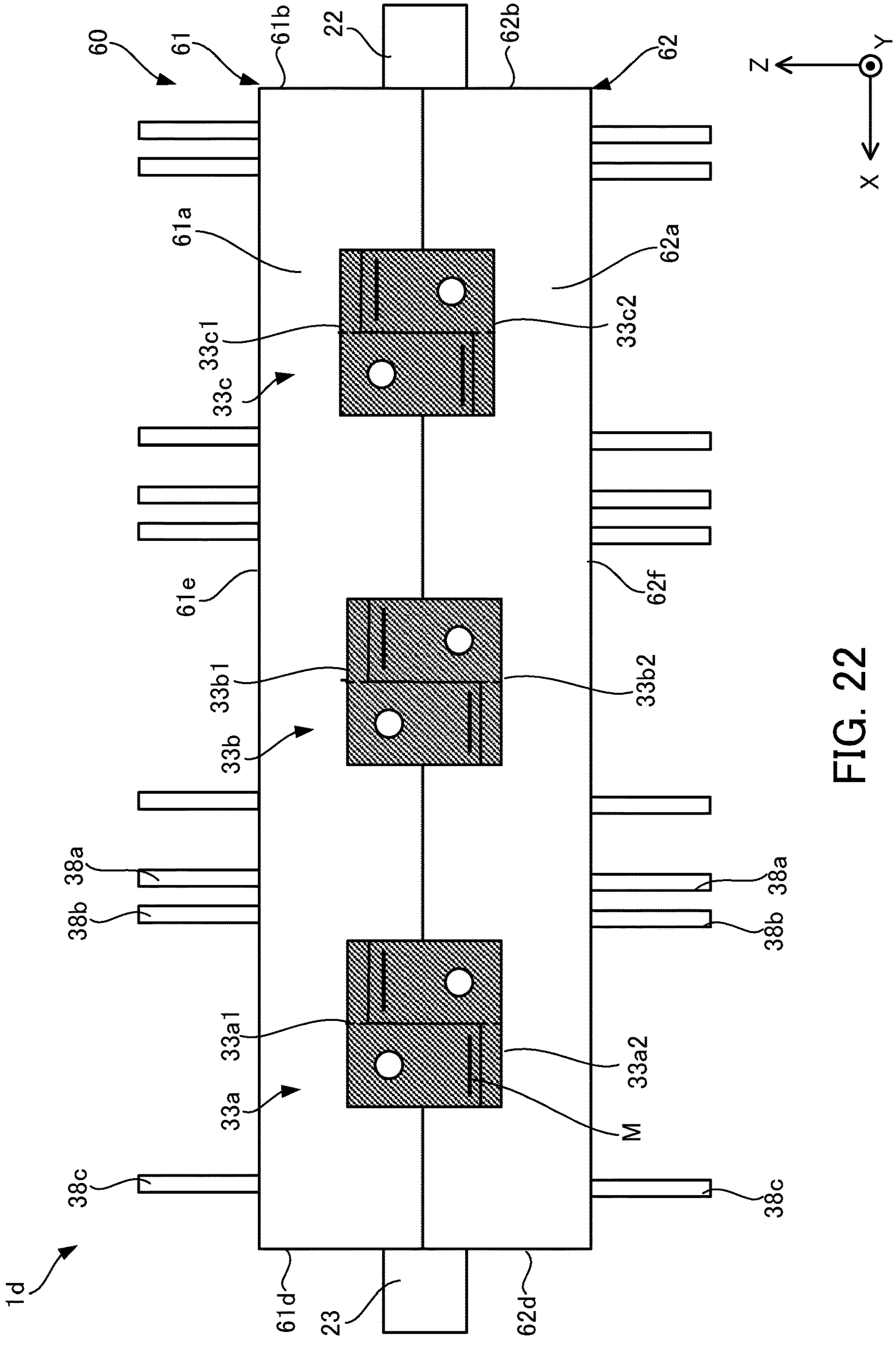
FIG. 22 is a side view (on an output terminal side) of a semiconductor device according to a fifth embodiment.
Figure 23B:
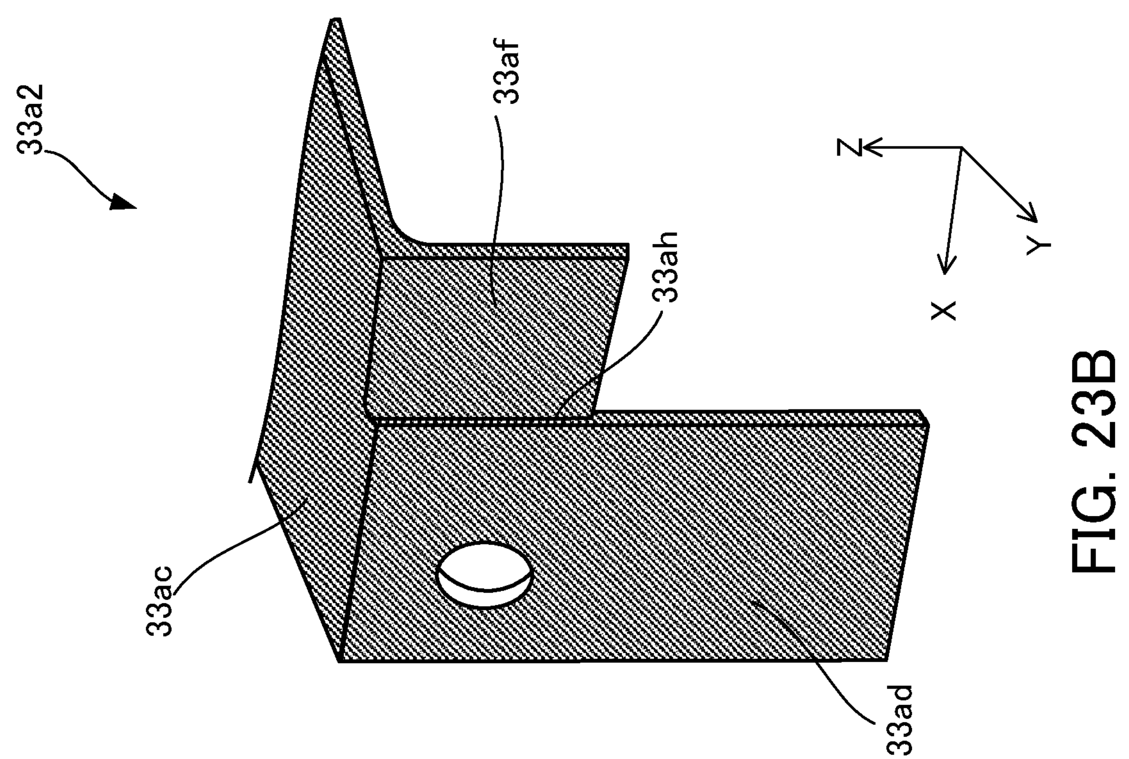
FIGS. 23A and 23B are perspective views of output terminals included in the semiconductor device according to the fifth embodiment.
Figure 23A:
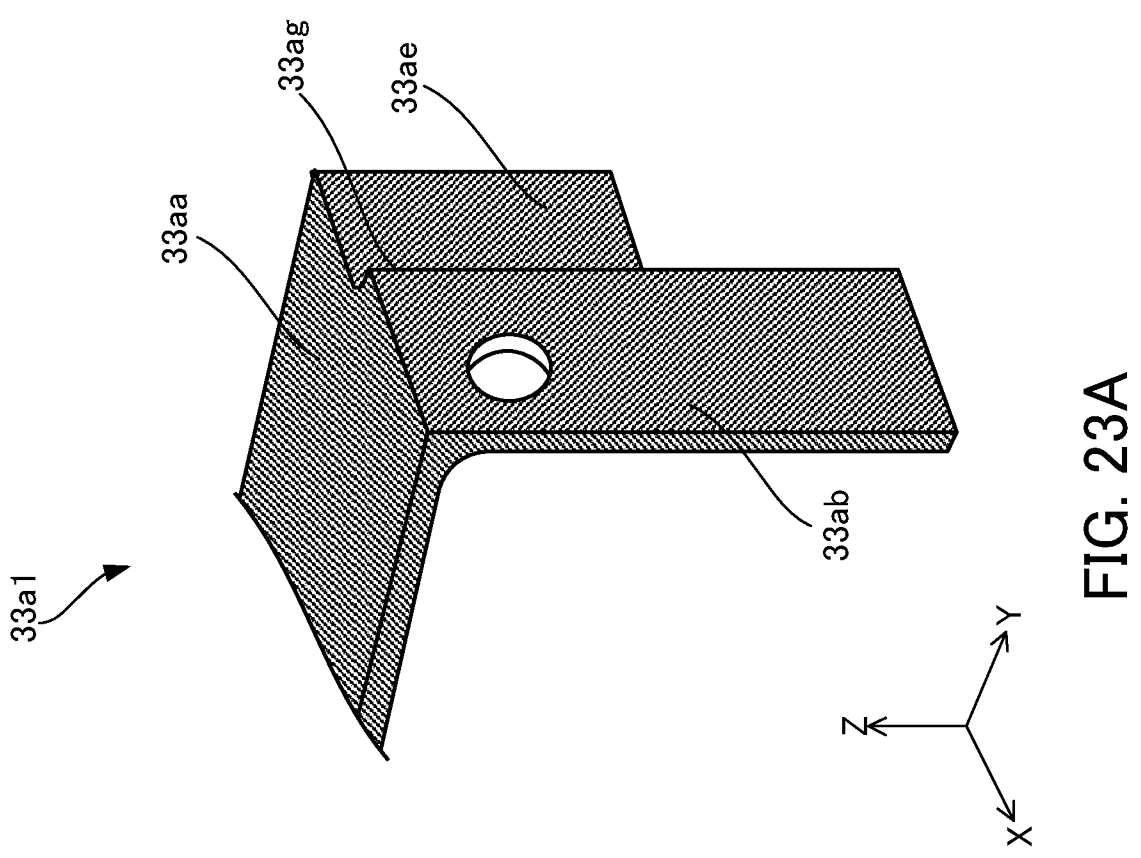

In this fifth embodiment, a different configuration of the output terminals of the semiconductor device 1*b* according to the third embodiment will be described with reference to FIG. 22 and FIGS. 23A and 23B. FIG. 22 is a side view (depicting output terminals) of the semiconductor device according to the fifth embodiment. FIGS. 23A and 23B are perspective views of output terminals included in the semiconductor device according to the fifth embodiment. Note that FIG. 23A is a perspective view of an upper terminal portion 33*al*, and FIG. 23B is a perspective view of a lower terminal portion 33*a*2. Also, as described later, the upper terminal portion 33*a*1 and the lower terminal portion 33*a*2 are formed with the same configuration. For this reason, FIG. 23B may be regarded as a perspective view of the upper terminal portion 33_a_1 in FIG. 23A when looking from the opposite direction, and FIG. 23A as a perspective view of the lower terminal portion 33_a_2 in FIG. 23B when looking from the opposite direction. In this fifth embodiment also, only configurations that differ from the semiconductor device 1_b_ will be described.

The semiconductor device 1_d_ includes output terminals 33_a_ to 33_c_. These output terminals 33_a_ to 33_c_ include upper terminal portions 33_a_1 to 33_c_1 and lower terminal portions 33_a_2 to 33_c_2. Here, the upper terminal portion 33_al_ and the lower terminal portion 33_a_2 depicted in FIGS. 23A and 23B will be described as examples. Note that the upper terminal portion 33_a_1 and the lower terminal portion 33_a_2 have the same configuration. The upper terminal portions 33_b_1 and 33_c_1 and the lower terminal portions 33_b_2 and 33_c_2 also have the same configurations as the upper terminal portion 33_a_1 and the lower terminal portion 33_a_2.

The upper terminal portion 33_a_1 is formed as a flat plate that is L shaped when viewed from the side (in the ±X direction). This upper terminal portion 33_a_1 includes a wiring portion 33_aa_, a contact portion 33_ab_, and a bonding portion 33_ae_. The wiring portion 33_aa_ is shaped as a flat plate, and has a second end portion (on the inside of the semiconductor device 1_d_) that is bonded to the wiring board 13_b_ of an insulated circuit board 11 on the top plate 21_a_ of the cooling unit 20. This wiring portion 33_aa_ may be formed in an L shape, for example, like the wiring portion 31_a_5 of the positive terminal 31_a_ in FIG. 17.

The contact portion 33_ab_ is formed as a flat plate, is integrally connected to the left half (when looking in the +Y direction) of a first end portion of the wiring portion 33_aa_, and extends in the −Z direction. A through hole may also be formed in the contact portion 33_ab_. Note that the wiring portion 33_aa_ and the contact portion 33_ab_ may have the same thickness and be uniform.

The bonding portion 33_ae_ is formed as a flat plate, is integrally connected to the right half (when looking in the +Y direction) of the first end portion of the wiring portion 33_aa_, and extends in the −Z direction. In other words, the bonding portion 33_ae_ is provided adjacent to the contact portion 33_ab_ in a direction (the +X direction or a second direction) perpendicular to the connecting direction (that is, the ±Z direction or the first direction) of the upper body portion 61 and the lower body portion 62. However, the length of the bonding portion 33_ae_ in the −Z direction is shorter than the length in the same direction of the contact portion 33_ab_. As one example, the length in the −Z direction of the contact portion 33_ab_ is around half the length in the same direction of the contact portion 33_ab_. The thickness of the bonding portion 33_ae_ is thinner than the thickness of the contact portion 33_ab_, so that a stepped portion 33_ag_ is formed between the bonding portion 33_ae_ and the contact portion 33_ab_.

In the same way, the lower terminal portion 33_a_2 includes a wiring portion 33_ac_, a contact portion 33_ad_, and a bonding portion 33_af_, and a stepped portion 33_ah_ is provided between the contact portion 33_ad_ and the bonding portion 33_af_. The wiring portion 33_ac_, the contact portion 33_ad_, and the bonding portion 33_af_ are the same as the wiring portion 33_aa_, the contact portion 33_ab_, and the bonding portion 33_ae_ of the upper terminal portion 33_al_. In other words, the bonding portion 33_af_ is also provided adjacent to the contact portion 33_ad_ in a direction (the +X direction or a third direction) perpendicular to the connecting direction (that is, the ±Z direction or the first direction) of the upper body portion 61 and the lower body portion 62. Accordingly, a second end portion (on the inside the semiconductor device 1_d_) of the wiring portion 33_ac_ of the lower terminal portion 33_a_2 is bonded to the wiring board 13_a_ of an insulated circuit board 11 on the bottom plate 21_b_ of the cooling unit 20.

The upper terminal portion 33_a_1 and the lower terminal portion 33_a_2 with the above configuration are included in the semiconductor device 1_d_ in an assembled state as depicted in FIG. 22. In the assembled state, the contact portion 33_ab_ of the upper terminal portion 33_a_1 overlaps the front surface of the bonding portion 33_af_ of the lower terminal portion 33_a_2. In addition, the contact portion 33_ad_ of the lower terminal portion 33_a_2 overlaps the front surface of the bonding portion 33_ae_ of the upper terminal portion 33_al_.

In addition, as one example, laser welding is performed from the front surface of the contact portion 33_ab_ of the upper terminal portion 33_al_. By doing so, the contact portion 33_ab_ of the upper terminal portion 33_a_1 and the bonding portion 33_af_ of the lower terminal portion 33_a_2 are bonded. Laser welding is performed in the same way from the front surface of the contact portion 33_ad_ of the lower terminal portion 33_a_2. By doing so, the contact portion 33_ad_ of the lower terminal portion 33_a_2 and the bonding portion 33_ae_ of the upper terminal portion 33_a_1 are bonded. Note that laser weld marks M produced by the laser welding are depicted on the upper terminal portions 33_a_1 to 33_c_1 and the lower terminal portions 33_a_2 to 33_c_2 in FIG. 22. Through the above processes, the upper terminal portion 33_a_1 and the lower terminal portion 33_a_2 are bonded to construct the output terminal 33_a_. The upper terminal portions 33_b_1 and 33_c_1 and the lower terminal portions 33_b_2 and 33_c_2 are bonded in the same way to construct the output terminals 33_b_ and 33_c_.

The output terminals 33_a_ to 33_c_ including the upper terminal portions 33_a_1 to 33_c_1 and the lower terminal portions 33_a_2 to 33_c_2 are integrally molded with the upper body portion 61 and the lower body portion 62, respectively, of the case 60. Note that in the same way as the third embodiment, the positive terminals 31_a_ to 31_c_, the negative terminals 32_a_ to 32_c_, the control terminals 38_a_, and the detection terminals 38_b_ and 38_c_ may also be integrally molded with the upper body portion 61 and the lower body portion 62 of the case 60. Note that the insulated circuit board 11 depicted in FIG. 8 may be used.

According to the present disclosure, a semiconductor device is miniaturized while simplifying the electrical connections and improving handling.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:

a first semiconductor unit including a first semiconductor chip and a first substrate, the first substrate including, on a first main surface thereof, a first input wiring board, to which the first semiconductor chip is bonded, and a first output wiring board;

a second semiconductor unit including a second semiconductor chip and a second substrate, the second substrate including, on a second main surface thereof, a second input wiring board, to which the second semiconductor chip is bonded, and a second output wiring board;

a cooling unit having a first side in a plan view of the semiconductor device and including a first cooling surface and a second cooling surface that are opposite to each other and respectively have thereon the first semiconductor unit facing the first substrate and the second semiconductor unit facing the second substrate so that the cooling unit is sandwiched between the first and second semiconductor units; and an output terminal provided at the first side of the cooling unit and being connected to both the first output wiring board and the second input wiring board.

2. A semiconductor device, comprising:

a first semiconductor unit including a first semiconductor chip and a first substrate, the first substrate including, on a first main surface thereof, a first wiring board to which the first semiconductor chip is bonded;

a second semiconductor unit including a second semiconductor chip and a second substrate, the second substrate including, on a second main surface thereof, a second wiring board to which the second semiconductor chip is bonded;

a cooling unit having a first side in a plan view of the semiconductor device and including a first cooling surface and a second cooling surface that are opposite to each other and respectively have thereon the first semiconductor unit facing the first substrate and the second semiconductor unit facing the second substrate so that the cooling unit is sandwiched between the first and second semiconductor units; and an output terminal provided at the first side of the cooling unit and being connected to both the first wiring board and the second wiring board, wherein the first semiconductor chip includes a first output electrode provided on a front surface thereof and a first input electrode provided on a rear surface thereof, the second semiconductor chip includes a second output electrode provided on a front surface thereof and a second input electrode provided on a rear surface thereof, the first wiring board includes first input wiring to which the rear surface of the first semiconductor chip is bonded and first output wiring that is adjacent to the first input wiring and is electrically connected to the first output electrode of the first semiconductor chip, the second wiring board includes second input wiring to which the rear surface of the second semiconductor chip is bonded and second output wiring that is adjacent to the second input wiring and is electrically connected to the second output electrode of the second semiconductor chip, and the output terminal connects the first input wiring to the second output wiring.

3. The semiconductor device according to claim 2, wherein the cooling unit further has a second side that is opposite the first side in the plan view, the first substrate is disposed such that the first input wiring is closer to the second side of the cooling unit than is the first output wiring, and the first output wiring is closer to the first side of the cooling unit than is the first input wiring, and the second substrate is disposed such that the second output wiring is closer to the second side of the cooling unit than is the second input wiring, and the second input wiring is closer to the first side of the cooling unit than is the second output wiring.

4. The semiconductor device according to claim 3, further comprising:

a positive terminal connected to the first input wiring and extending outward from the second side of the cooling unit; and a negative terminal connected to the second output wiring and extending outward from the second side of the cooling unit.

5. The semiconductor device according to claim 4, further comprising a first insulating jig covering the first side of the cooling unit, wherein the output terminal covers an outer surface of the first insulating jig.

6. The semiconductor device according to claim 5, further comprising a second insulating jig covering the second side of the cooling unit, wherein the second insulating jig has first and second surfaces opposite to each other, and a side surface connecting the first and second surfaces, the side surface being parallel to the second side of the cooling unit in the plan view, the first and second surfaces respectively facing same directions as the first and second cooling surfaces, the positive terminal continuously covers the first surface of the second insulating jig and a part of the side surface of the second insulating jig, and the negative terminal continuously covers the second surface of the second insulating jig and an other part of the side surface of the second insulating jig.

7. The semiconductor device according to claim 5, wherein the negative terminal has a first front end portion that extends outward from the second side of the cooling unit, and the positive terminal has a second front end portion that extends outward from the second side of the cooling unit, the second front end portion overlapping the first front end portion with insulating paper in between to form a step.

8. The semiconductor device according to claim 5, further comprising an encapsulating member that encapsulates the first semiconductor unit, the second semiconductor unit, and the cooling unit, and that has a first side surface facing the first side of the cooling unit and a second side surface facing the second side of the cooling unit, the output terminal being exposed outside the encapsulating member from the first side surface, the positive terminal and the negative terminal being exposed outside the encapsulating member from the second side surface.

9. The semiconductor device according to claim 4, further comprising a case including an upper body that covers the first semiconductor unit and the cooling unit from a first semiconductor unit side, and a lower body that covers the second semiconductor unit and a cooling unit from the second semiconductor unit side, the upper body and the lower body being disposed together facing each other in a first direction perpendicular to the first and second cooling surfaces.

10. The semiconductor device according to claim 9, wherein the positive terminal is exposed on a side surface of the upper body that faces the second side of the cooling unit, and the negative terminal is exposed on a side surface of the lower body that faces the second side of the cooling unit.

11. The semiconductor device according to claim 10, wherein the positive terminal has a first contact portion that is exposed outside of the upper body, and the negative terminal has a second contact portion that is exposed outside of the lower body portion, and the first connection portion and the second connection portion are aligned in the first direction on the case.

12. The semiconductor device according to claim 10, wherein the output terminal includes an upper terminal portion and a lower terminal portion, the upper terminal portion is electrically connected to the first input wiring and extends from a side surface of the upper body portion that faces the first side of the cooling unit, and the lower terminal portion is electrically connected to the second output wiring, extends from a side surface of the lower body portion that faces the first side of the cooling unit, and coincides with the upper terminal portion in the plan view.

13. The semiconductor device according to claim 10, wherein the output terminal includes an upper terminal portion and a lower terminal portion, the upper terminal portion includes:

a first contact portion, which is formed as a flat plate, is electrically connected to the first input wiring, and is exposed from a side surface of the upper body portion that faces the first side of the cooling unit; and a first bonding portion, which is provided adjacent to the first contact portion in a second direction perpendicular to the first direction, and is less in thickness and shorter in length than the first contact portion, the lower terminal portion includes:

a second contact portion, which is formed as a flat plate, is electrically connected to the second output wiring, and is exposed from a side surface of the lower body portion that faces the first side of the cooling unit; and a second bonding portion, which is provided adjacent to the second contact portion in a third direction perpendicular to the first direction, and is less in thickness and shorter in length than the second contact portion, and the upper terminal portion and the lower terminal portion are arranged such that, while the lower body portion and the upper body portion are disposed together facing each other in the first direction, the second contact portion overlaps the first bonding portion and the first contact portion overlaps the second bonding portion.

* * * * *